United States Patent
Lee et al.

(10) Patent No.: US 9,109,784 B2
(45) Date of Patent: Aug. 18, 2015

(54) LED-BASED LIGHTING APPARATUS WITH HEAT PIPE COOLING STRUCTURE

(75) Inventors: Su Woon Lee, Seongnam-si (KR); Seung Ki Kim, Seongnam-si (KR); Jung Hwa Kim, Seongnam-si (KR); Seon Min Park, Seongnam-si (KR); Hwi Seok Yang, Seongnam-si (KR); Yu Jin Heo, Seongnam-si (KR)

(73) Assignee: Posco LED Company Ltd., Seongnam-si (KR)

( * ) Notice: Subject to any disclaimer, the term of this patent is extended or adjusted under 35 U.S.C. 154(b) by 355 days.

(21) Appl. No.: 13/480,247

(22) Filed: May 24, 2012

(65) Prior Publication Data

US 2013/0077293 A1    Mar. 28, 2013

(30) Foreign Application Priority Data

Sep. 26, 2011 (KR) .................. 10-2011-0097164
Oct. 31, 2011 (KR) .................. 10-2011-0112337
Oct. 31, 2011 (KR) .................. 10-2011-0112338
Oct. 31, 2011 (KR) .................. 10-2011-0112339
Dec. 30, 2011 (KR) .................. 10-2011-0147025

(51) Int. Cl.
*F21V 29/00* (2006.01)
*F21V 29/67* (2015.01)
*F21V 29/76* (2015.01)
*F21Y 101/02* (2006.01)
*F21Y 105/00* (2006.01)
(Continued)

(52) U.S. Cl.
CPC ............ *F21V 29/006* (2013.01); *F21V 29/677* (2015.01); *F21V 29/763* (2015.01); *F21V 29/767* (2015.01); *F21V 29/71* (2015.01); *F21V 29/83* (2015.01); *F21Y 2101/02* (2013.01); *F21Y 2105/001* (2013.01); *H01L 2924/0002* (2013.01)

(58) Field of Classification Search
USPC ............ 362/547, 218, 240, 249.02, 294, 373; 165/104.21, 104.33
See application file for complete search history.

(56) References Cited

U.S. PATENT DOCUMENTS 4,411,516 A * 10/1983 Adachi et al. ................. 362/294
5,793,611 A    8/1998 Nakazato et al.
(Continued)

FOREIGN PATENT DOCUMENTS

JP    H07-283564    10/1995
JP    2000-049479    2/2000
(Continued)

OTHER PUBLICATIONS

Written Opinion submitted with International Application PCT/KR2012/004084 dated Nov. 30, 2012.
(Continued)

*Primary Examiner* — Ismael Negron
(74) *Attorney, Agent, or Firm* — H.C. Park & Associates, PLC

(57) ABSTRACT

A lighting apparatus includes a housing, a light emitting module disposed on an open region at one side of the housing, and a heat sink unit placed within the housing to absorb and discharge heat from the light emitting module. The light emitting module includes a heat sink base on which a semiconductor optical device is mounted. The heat sink unit includes at least one main heat pipe having one side adjoining the heat sink base and a heat sink block adjoining the other side of the main heat pipe to cooperate with the main heat pipe.

22 Claims, 19 Drawing Sheets

(51) Int. Cl.
*F21V 29/71* (2015.01)
*F21V 29/83* (2015.01)

(56) References Cited

U.S. PATENT DOCUMENTS

| | | | |
|---|---|---|---|
| 7,278,470 B2 | 10/2007 | Xia et al. | |
| 7,338,186 B1* | 3/2008 | Wu et al. | 362/294 |
| 7,513,651 B2* | 4/2009 | Chen | 362/294 |
| 7,548,426 B2* | 6/2009 | Liu | 165/104.21 |
| 7,611,263 B2* | 11/2009 | Huang et al. | 362/294 |
| 7,740,379 B2* | 6/2010 | Lin et al. | 362/294 |
| 7,922,371 B2* | 4/2011 | Qin | 362/373 |
| 8,191,612 B2* | 6/2012 | Huang | 165/104.21 |
| 2005/0103476 A1* | 5/2005 | Chen et al. | 165/104.33 |
| 2009/0236078 A1 | 9/2009 | Luo | |
| 2010/0026185 A1 | 2/2010 | Betsuda et al. | |
| 2010/0188818 A1* | 7/2010 | Li | 165/104.21 |
| 2010/0321950 A1* | 12/2010 | Wong | 362/547 |
| 2011/0216536 A1 | 9/2011 | Okazaki et al. | |
| 2011/0235329 A1 | 9/2011 | Song et al. | |
| 2011/0305020 A1* | 12/2011 | Wang | 362/294 |
| 2012/0211201 A1 | 8/2012 | Kunstwadl et al. | |

FOREIGN PATENT DOCUMENTS

| | | |
|---|---|---|
| JP | 2001-217357 | 8/2001 |
| JP | 2005-116815 | 4/2005 |
| JP | 2006-58487 | 3/2006 |
| JP | 3121916 | 5/2006 |
| JP | 3126337 | 9/2006 |
| JP | 2008-016605 | 1/2008 |
| JP | 2010-040221 | 2/2010 |
| JP | 3158033 | 2/2010 |
| JP | 2010-287561 | 12/2010 |
| JP | 2011-165351 | 8/2011 |
| JP | 2011-187264 | 9/2011 |
| JP | 2011-204663 | 10/2011 |
| KR | 10-0922433 | 10/2009 |
| KR | 10-2010-0106729 | 10/2010 |
| KR | 10-1011379 | 1/2011 |
| KR | 10-1022485 | 3/2011 |
| KR | 10-2011-0116559 | 10/2011 |
| KR | 10-2011-0136175 | 12/2011 |
| WO | 2011032554 | 3/2011 |

OTHER PUBLICATIONS

International Search Report submitted with International Application PCT/KR2012/004084 dated May 23, 2012.

* cited by examiner (a)　　　　　　　　　　(b)

LED-BASED LIGHTING APPARATUS WITH HEAT PIPE COOLING STRUCTURE

CROSS-REFERENCE TO RELATED APPLICATIONS

This application claims priority from and the benefit of Korea patent Application No. 10-2011-0097164, filed on Sep. 26, 2011, No. 10-2011-0112337, filed on Oct. 31, 2011, No. 10-2011-0112338, filed on Oct. 31, 2011, No. 10-2011-0112339, filed on Oct. 31, 2011, and No. 10-2011-0147025, filed on Dec. 30, 2011, which are hereby incorporated by references for all purposes as if fully set forth herein.

BACKGROUND OF THE INVENTION

1. Field of the Invention

Embodiments of the invention relate to optical semiconductor-based lighting apparatuses.

2. Discussion of the Background

Generally, fluorescent lamps and incandescent lamps are used as a light source for lighting. Incandescent lamps have low economic feasibility due to high power consumption and thus demand for incandescent lamps continues to decrease. Further, it is predicted that this trend will continue into the future. On the contrary, fluorescent lamps have higher economic feasibility due to low power consumption, which is about ⅓ that of incandescent lamps. However, fluorescent lamps require application of high voltage, causing a blackening phenomenon and shortening the lifespan thereof. Further, mercury injected together with argon gas into a vacuum glass tube of a fluorescent lamp is toxic and environmentally harmful.

Recently, needs for LED lighting apparatuses employing an LED as a light source have been rapidly increased. The LED lighting apparatus has long lifespan and requires low power for operation. Further, the LED lighting apparatus does not use a toxic substance such as mercury, thereby guaranteeing environmental friendliness.

Recently, a semiconductor optical device, such as a light emitting device (LED), is increasingly used as a light source of a lighting apparatus, such as a factory lighting fixture, street lamp, security light, and the like, which require high light output. Such a lighting apparatus generates large amounts of heat during operation of a light emitting module including semiconductor optical devices.

Typically, a conventional optical semiconductor-based lighting apparatus is provided with a heat sink disposed to adjoin a heat sink base or a printed circuit board (PCB), on which semiconductor optical devices are mounted, to dissipate heat. However, it is recognized that such a conventional lighting apparatus suffers from many restrictions in improvement of heat dissipation efficiency through the heat sink. To solve such a problem, various studies and efforts have been made to apply a heat pipe structure for heat dissipation using fluid for absorption and discharge of heat to an optical semiconductor-based lighting apparatus.

In one conventional lighting apparatus, the heat pipe structure is disposed to adjoin a rear side of a heat sink base to promote heat dissipation, but provides limited improvement of heat dissipation efficiency due to a small surface area at a heat dissipation side. In addition, when applying the heat pipe structure to the rear side of the base of the light emitting module including semiconductor optical devices arranged thereon, a relationship between arrangement of the semiconductor optical devices and the heat pipe structure is not considered in the art. Further, since a fluid containing pipe is used as the heat pipe, there are many limits in suitable positioning of the heat pipe structure on the rear side of the heat sink base due to restrictions in pipe design and processing, and interference between the heat pipes.

Further, in another conventional lighting apparatus, a power supply such as a switching mode power supply (SMPS) is received within a housing. When AC current is supplied from outside, the SMPS converts the AC current into DC current and supplies the DC current to the semiconductor optical devices of the light emitting module in the housing. However, since the power supply such as SMPS generates large amounts of heat during operation and the heat remains at an upper housing section, there is a need for efficient cooling of the SMPS.

The optical semiconductor-based lighting apparatus is applied to lighting fixtures at places such as factories, where severe scattering of dust or fine particles occurs. Although the optical semiconductor-based lighting apparatus includes an optical member made of glass or synthetic resin to protect a light source from the surroundings, various kinds of foreign matter including dust and fine particles in such a poor environment are likely to adhere to the optical member, causing a reduction in light output. Therefore, there is a need for a technique that facilitates removal of foreign matter from the optical member.

SUMMARY OF THE INVENTION

An exemplary embodiment of the present invention provides an optical semiconductor-based lighting apparatus which can solve such problems of the related art.

Additional features of the invention will be set forth in the description which follows, and in part will be apparent from the description, or may be learned by practice of the invention.

In accordance with an aspect of the present invention, an optical semiconductor-based lighting apparatus includes: a housing; a light emitting module disposed on an open region at one side of the housing; and a heat sink unit placed within the housing to absorb and discharge heat from the light emitting module. The light emitting module includes a heat sink base on which a semiconductor optical device is mounted, and the heat sink unit includes at least one main heat pipe having one side adjoining the heat sink base and a heat sink block adjoining the other side of the main heat pipe to cooperate with the main heat pipe.

In one embodiment, the heat sink block may include a plurality of heat sink plates separated from each other to be parallel to each other, and the main heat pipe may be disposed to pass through the heat sink plates.

In one embodiment, a ratio of a thickness of each of the heat sink plates to a distance between the heat sink plates may be in the range from 1:1.5 to 1:5.

In one embodiment, the main heat pipe may include a lower line section adjoining the heat sink base, an upper line section penetrating the heat sink plates, and a middle line section connecting the lower line section to the upper line section.

In one embodiment, the heat sink unit may include a first main heat pipe and a second main heat pipe, and the first and second main heat pipes may penetrate the heat sink plates at different heights by a height difference between the middle line sections.

In one embodiment, the first main heat pipe and the second main heat pipe may be alternately arranged.

In one embodiment, the lighting apparatus may further include at least one subsidiary heat pipe independent of the heat sink block and disposed on the heat sink base.

In one embodiment, the heat sink base may have a dense region where a plurality of main heat pipes is densely arranged, and the subsidiary heat pipe may be placed outside the dense region.

In one embodiment, the subsidiary heat pipe may include a peripheral line section formed along a periphery of the heat sink base.

In one embodiment, each of the upper and lower line sections may have a straight line shape.

In one embodiment, the middle line section may be perpendicular to the upper and lower line sections.

In one embodiment, the lighting apparatus may further include a pipe securing unit that secures a line section of the main heat pipe to the base, and the pipe securing unit may include a lower securing plate defining a groove for receiving the line section of the main heat pipe and an upper securing plate covering the groove and fastened to an upper surface of the lower securing plate.

In one embodiment, the lighting apparatus may further include a cooling fan disposed within the housing to cool the heat sink plates with forced air, and the heat sink plates may be separated from the heat sink base with lower ends thereof placed adjacent the heat sink base and may be separated from the cooling fan with upper ends thereof placed adjacent the cooling fan.

In accordance with another aspect of the present invention, an optical semiconductor-based lighting apparatus includes: a housing; a light emitting module disposed on an open region at one side of the housing; and a heat sink unit placed within the housing to absorb and discharge heat from the light emitting module. The light emitting module includes a printed circuit board on which a plurality of semiconductor optical devices is mounted, and a heat sink base having a front side to which the printed circuit board is attached. The heat sink unit includes at least one overall contact type heat pipe adjoining a rear side of the heat sink base over an entire length of the overall contact type heat pipe and at least one partial contact type heat pipe adjoining the rear side of the heat sink base over a partial length of the partial contact type heat pipe.

In one embodiment, the overall contact type heat pipe may include a peripheral line section disposed corresponding to at least part of an outer peripheral arrangement of the semiconductor optical device.

In one embodiment, the overall contact type heat pipe may include at least two line sections defined by bending.

In one embodiment, the partial contact type heat pipes may be concentrated together with another partial contact type heat pipe on a region of the heat sink base, and the overall contact type heat pipe may be disposed in a predetermined shape outside the region.

In one embodiment, the lighting apparatus may further include a heat sink block separated from the heat sink base, and the partial contact type heat pipe may include a lower horizontal line section horizontally adjoining the heat sink base and an upper horizontal line section horizontally penetrating the heat sink block. Here, the upper and lower horizontal line sections are integrally formed with each other.

In one embodiment, the overall contact type heat pipe may include a peripheral line section and an inner line section, which are integrally formed with each other. The peripheral line section may be disposed along a periphery of the heat sink base outside the region at which the partial contact type heat pipes are concentrated, and the inner line section may be disposed inside the heat sink base.

In one embodiment, the lighting apparatus may further include a pipe securing unit that secures the partial contact type heat pipe or the overall contact type heat pipe to a rear side of the heat sink base. The pipe securing unit includes a lower securing plate defining a groove for receiving at least part of the partial contact type heat pipe or overall contact type heat pipe and an upper securing plate covering the groove and fastened to an upper surface of the lower securing plate.

In accordance with a further aspect of the present invention, an optical semiconductor-based lighting apparatus includes: a housing; a light emitting module disposed on an open region of a lower end of the housing; and a heat sink unit placed within the housing to absorb and discharge heat from the light emitting module. The light emitting module includes a heat sink base on which a semiconductor optical device is mounted, and the heat sink unit includes a plurality of heat pipes adjoining the heat sink base.

In one embodiment, the lighting apparatus may further include a heat sink block disposed to cooperate with at least one heat pipe among the plurality of heat pipes, and the heat sink block may include a plurality of heat sink plates.

In one embodiment, the housing may include an intersection region at which an upper housing section intersects a lower housing section within the housing, the heat sink block may be placed in the intersection region such that flat surfaces of the heat sink plates face downwards and gaps between the heat sink plates face in a lateral direction, and a cooling fan may be placed in a lateral direction of the heat sink block.

In one embodiment, the lighting apparatus may further include a power supply placed adjacent a rear end of the upper housing section, and the cooling fan may be placed between the power supply and the heat sink block.

In one embodiment, at least one of the heat pipes may extend upwards to penetrate the heat sink plates.

In one embodiment, the plurality of heat pipes may include main heat pipes adjoining the heat sink base in a straight line pattern, and the main heat pipes may extend upwards to penetrate the heat sink block.

In one embodiment, the plurality of heat pipes may include at least one subsidiary heat pipe independent of the heat sink block and adjoining the heat sink base.

In one embodiment, the subsidiary heat pipe may include a circular, arcuate, curved, or rounded pattern on the heat sink base.

In one embodiment, the main heat pipes may include horizontal line sections radially arranged on the heat sink base and vertical line sections vertically extending from the horizontal line sections and penetrating the heat sink block.

In one embodiment, the subsidiary heat pipe may be disposed near a periphery of the heat sink base, and the main heat pipes may be disposed in a central region surrounded by the subsidiary heat pipe.

In one embodiment, each of the heat sink plates may include a plurality of air flow holes.

In one embodiment, the housing may include an intersection region at which an upper housing section intersects a lower housing section within the housing, the heat sink block may be placed in the intersection region such that a lower surface of the heat sink block face downwards and a side surface of the heat sink block faces the cooling fan disposed at the upper housing section.

In accordance with yet another aspect of the present invention, an optical semiconductor-based lighting apparatus includes: a housing formed at one side thereof with an air suction port; a light emitting module including at least one semiconductor optical device and disposed on an open region at the other side of the housing; a power supply disposed within the housing to supply electric power to the light emitting module; and a cooling fan suctioning air through the air suction port to cool the power supply.

In one embodiment, the power supply may have one side surface adjacent the air suction port in a lateral direction and the cooling fan may be placed below the power supply.

In one embodiment, the light emitting module may be placed below the cooling fan and an exhaust port may be formed near the light emitting module or near the open region at the other side of the housing, on which the light emitting module is disposed.

In one embodiment, the lighting apparatus may further include an anti-fouling structure guiding air discharged through the exhaust port to flow from near a periphery of the light of the light emitting module towards the center of the light emitting module.

In one embodiment, the anti-fouling structure may include a vent guide slanted from near the periphery of the light emitting module towards the center thereof.

In one embodiment, the air suction port may be formed on at least one of a side surface and a ceiling surface of the housing, and the power supply may be separated from the ceiling surface of the housing.

In one embodiment, the lighting apparatus may further include a heat sink unit disposed adjacent the light emitting module to dissipate heat from the light emitting module.

In accordance with yet another aspect of the present invention, an optical semiconductor-based lighting apparatus includes: a housing having at least one air suction port; a light emitting module including at least one semiconductor optical device and disposed on an open region at a lower end of the housing; a power supply disposed at an upper portion within the housing; a heat sink unit disposed adjacent an upper portion of the light emitting module to dissipate heat from the light emitting module; and a cooling fan disposed between the heat sink unit and the power supply to force heat generated between the heat sink unit and the power supply to flow downwards.

In one embodiment, the air suction port may be placed adjacent the power supply in a lateral direction.

In one embodiment, the air suction port may be formed on at least one of a side surface and a ceiling surface of the housing to be placed adjacent the power supply.

In one embodiment, the power supply may be separated from the ceiling surface of the housing.

In one embodiment, an exhaust port may be formed near the open region of the lower end of the housing. Here, the power supply is cooled by air flowing between the air suction port and the cooling fan, and the heat sink unit is cooled by air flowing between the cooling fan and the exhaust port.

In one embodiment, the lighting apparatus may further include an anti-fouling structure, which guides air discharged through the exhaust port to flow from near a periphery of the light emitting module towards the center of the light emitting module.

In one embodiment, the heat sink unit may include a heat sink block composed of a plurality of heat sink plates between the cooling fan and the light emitting module, and gaps are formed between the heat sink plates to be open both at upper and lower sides thereof.

In accordance with yet another aspect of the present invention, an optical semiconductor-based lighting apparatus includes: a housing having an opening; an optical member mounted on the opening; a semiconductor optical device disposed within the housing to face the optical member; and an anti-fouling unit preventing foreign matter from being adhered to the optical member. The anti-fouling unit guides air discharged from the housing to flow towards the optical member.

In one embodiment, the anti-fouling unit may include a first ring coupled to the opening along a periphery of the opening and having a plurality of first slits formed parallel to the periphery of the optical member.

In one embodiment, the anti-fouling unit may further include a bent guide extending along an outer periphery of the first ring to be slanted with respect to the optical member.

In one embodiment, the anti-fouling unit may further include a second ring mounted along an outer periphery of the optical member and terminated at the first ring to be rotated in the clockwise or counterclockwise direction with respect to the first ring on the outer periphery of the optical member. The second ring may be formed with second slits corresponding to the first slit.

In one embodiment, the lighting apparatus may further include a fan suctioning air from one side of the housing and discharging the air through the periphery of the optical member.

In one embodiment, a distance between a point at which a virtual straight line extending from one end of the vent guide meets the optical member and the periphery of the opening of the housing may be longer than or equal to a distance from an inner periphery of the first ring to the periphery of the opening.

In one embodiment, the vent guide may include a plurality of guide pieces rotatably mounted along the outer periphery of the first ring.

In one embodiment, the vent guide may further include a resilient member extending from a first wire and connected to the housing. The first wire connects the guide pieces to each other.

According to the embodiments of the invention, the semiconductor optical device may have significantly improved heat dissipation performance through a heat sink base having semiconductor optical devices mounted thereon, the improved structure, disposition and/or arrangement of a heat pipe(s) adjoining the heat sink base to transfer heat therefrom, and subsidiary elements cooperating therewith. In addition, when including a heat generating component such as SMPS, the lighting apparatus according to the embodiments is advantageous to cool the heat generating component. Further, the lighting apparatus according to the embodiments is provided with an air cooling unit or cooling fan for cooling such heat generating components and semiconductor optical devices in an air cooling manner such that the heat generating components and the semiconductor optical devices can be simultaneously and efficiently cooled through an optimal arrangement of other components and the air cooling unit or cooling fan. Further, according to the embodiments of the invention, air forcibly discharged from the housing to the outside is guided towards the surface of the optical member of the light emitting module, thereby preventing foreign matter from accumulating on the light emitting module, particularly, on the external surface of the optical member thereof.

The above and other advantages of the present invention will become more apparent from the detailed description of the following embodiments of the invention.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
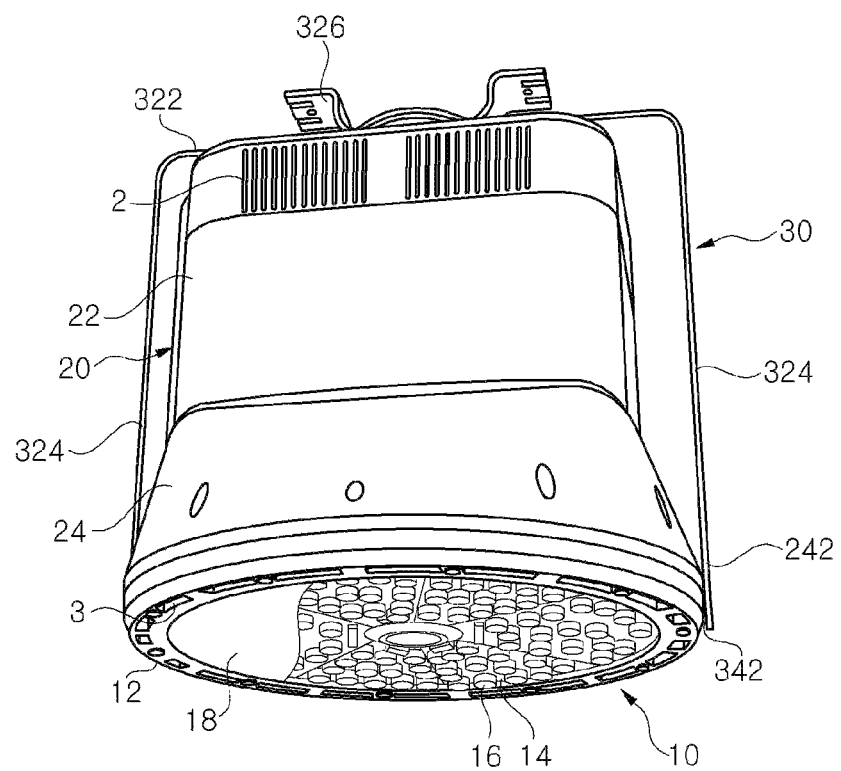
FIG. 1 is a perspective view of an optical semiconductor-based lighting apparatus according to one embodiment of the present invention.

Exemplary embodiments of the invention will now be described in detail with reference to the accompanying drawings. It should be understood that the embodiments are given to provide complete disclosure of the invention and to provide thorough understanding of the invention to those skilled in the art. Therefore, the present invention is not limited to the following embodiments and may be embodied in different ways. Further, the widths, lengths, and thicknesses of certain elements, layers or features may be exaggerated for clarity. Like components will be denoted by like reference numerals throughout the specification. Herein, spatially relative terms, such as "under", "below", "lower", "over", "upper" and the like, may be used for ease of description to describe the position, structure, and arrangement of respective elements, layers or features with respect to each other. It should be understood that the present invention is not limited by such terms unless the scope and sprit of the present invention are directly related to such terms.

Embodiments

Figure 2:
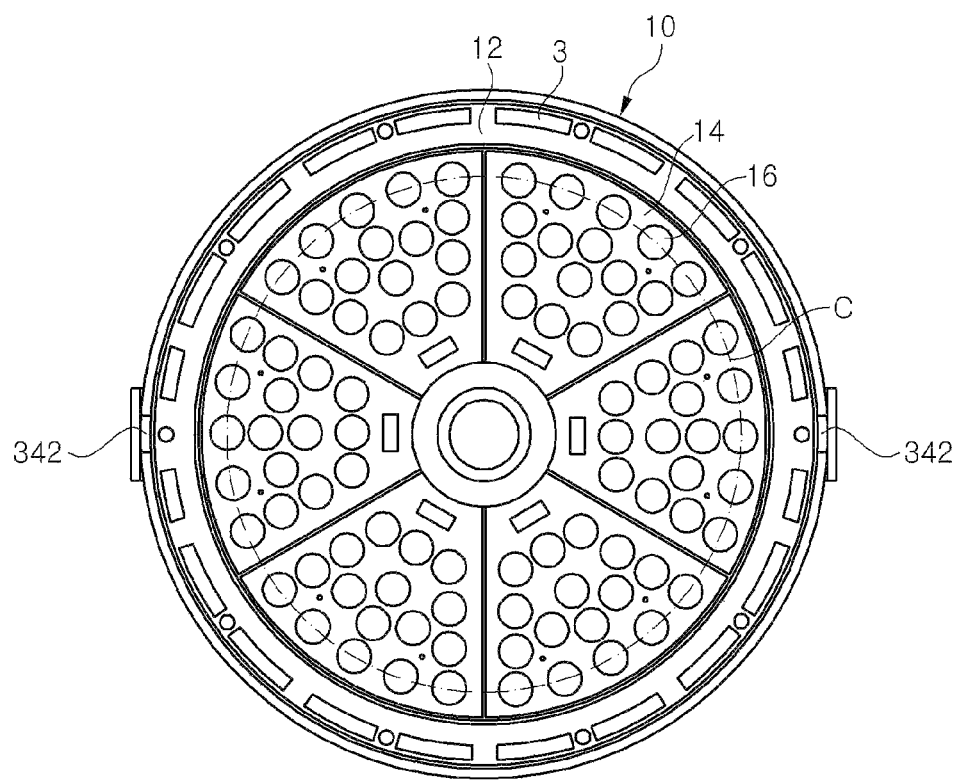
FIG. 2 is a plan view of a light emitting module of FIG. 1, with an optical cover removed therefrom.
Figure 3:
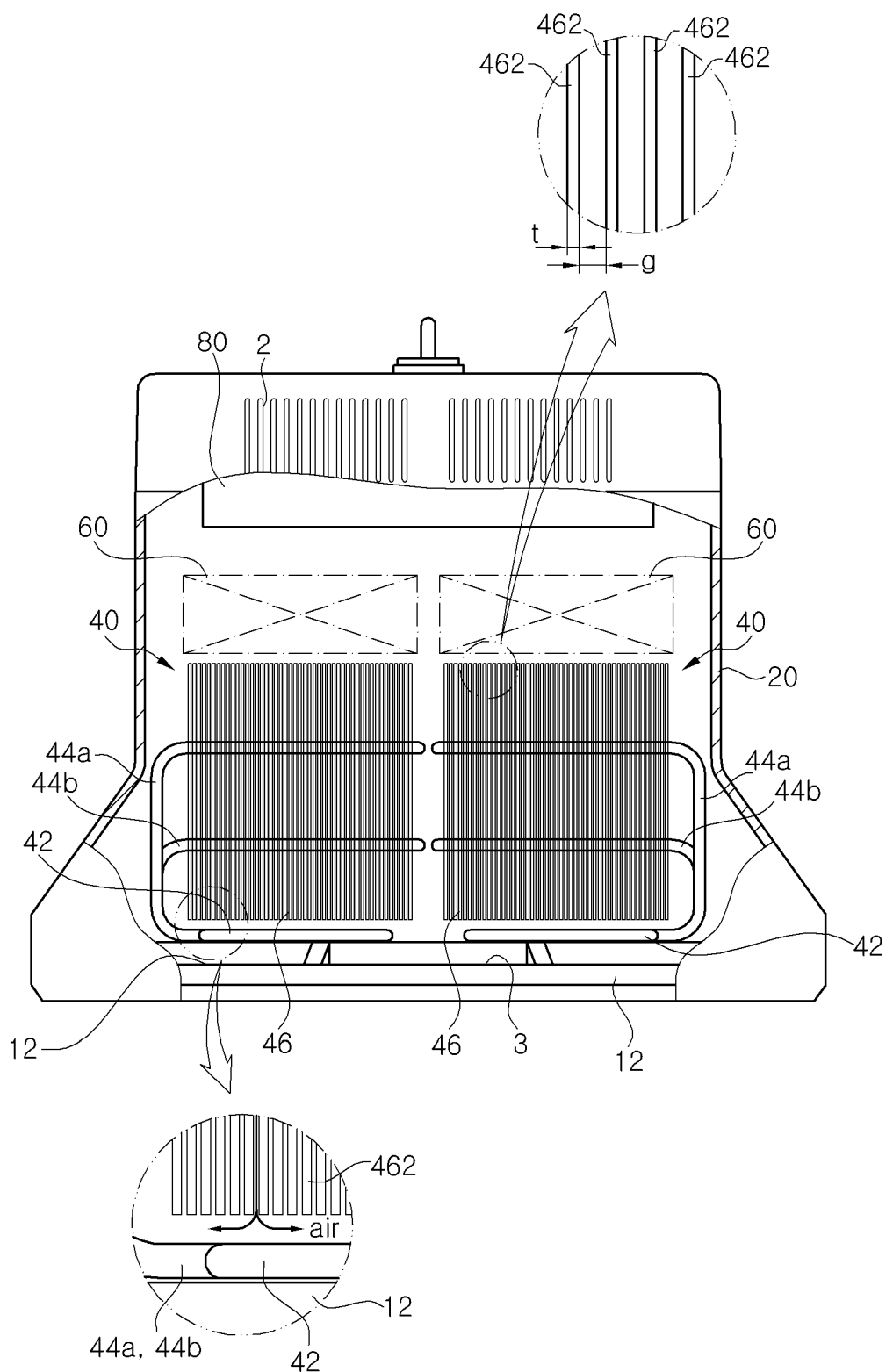
FIG. 3 is a partially cut-away front view of the lighting apparatus according to the embodiment of the present invention.
Figure 4:
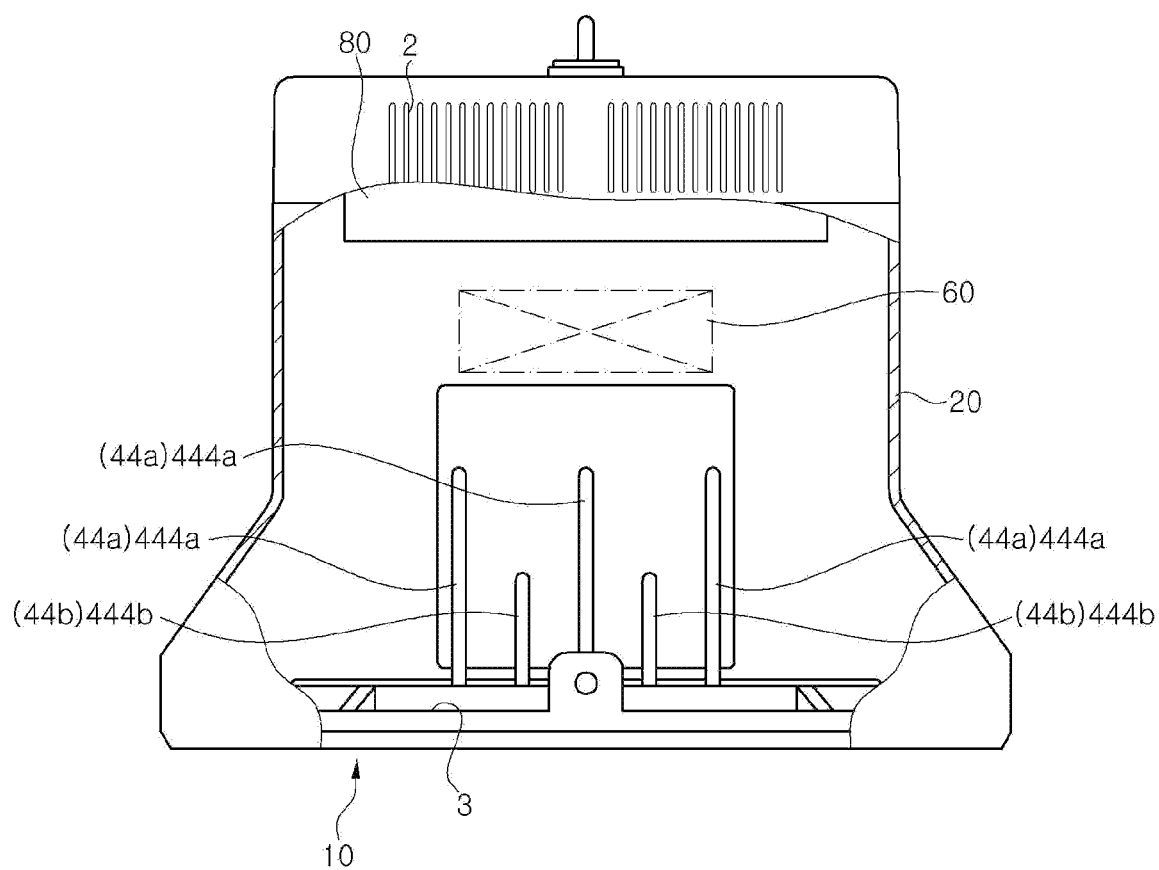
FIG. 4 is a partially cut-away side-sectional view of the lighting apparatus according to the embodiment of the present invention.
Figure 5:
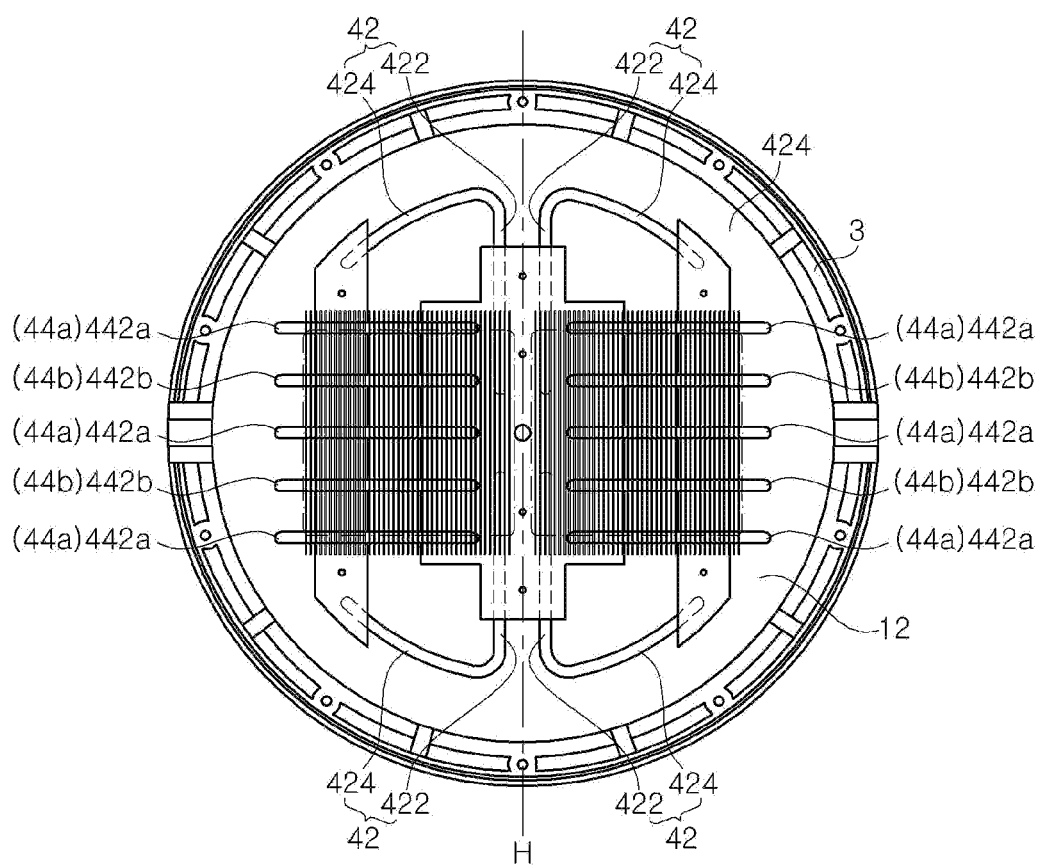
FIG. 5 is a top view of a cooling fan and a heat sink unit shown in FIG. 3 and FIG. 4.
Figure 6:
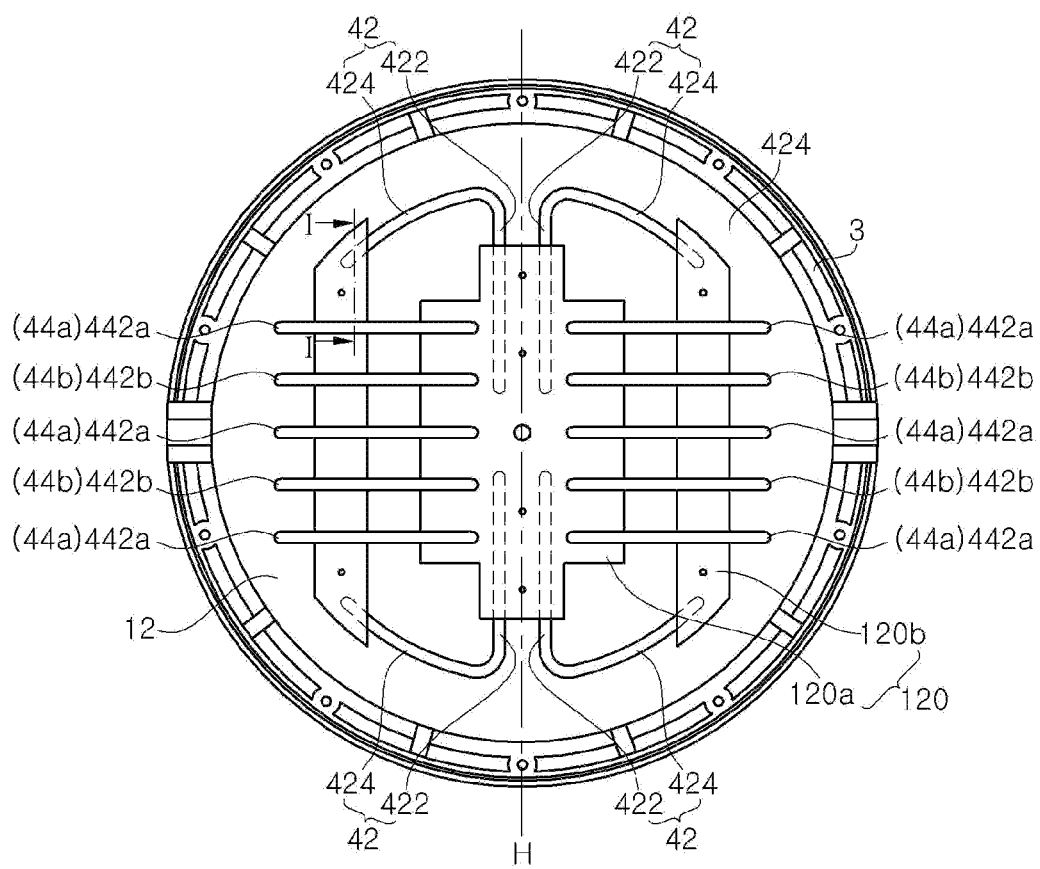
FIG. 6 is a top view of a heat sink base on which heat pipes of a heat sink unit are arranged.
Figure 7:
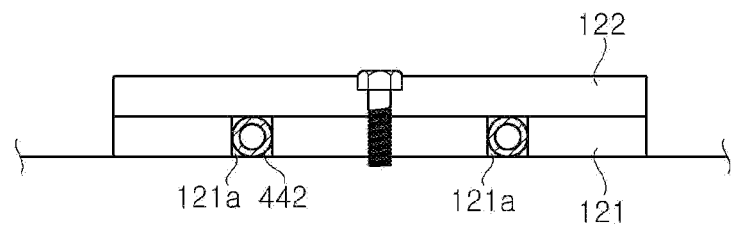
FIG. 7 is a cross-sectional view taken along line I-I of FIG. 6.
Figure 8:
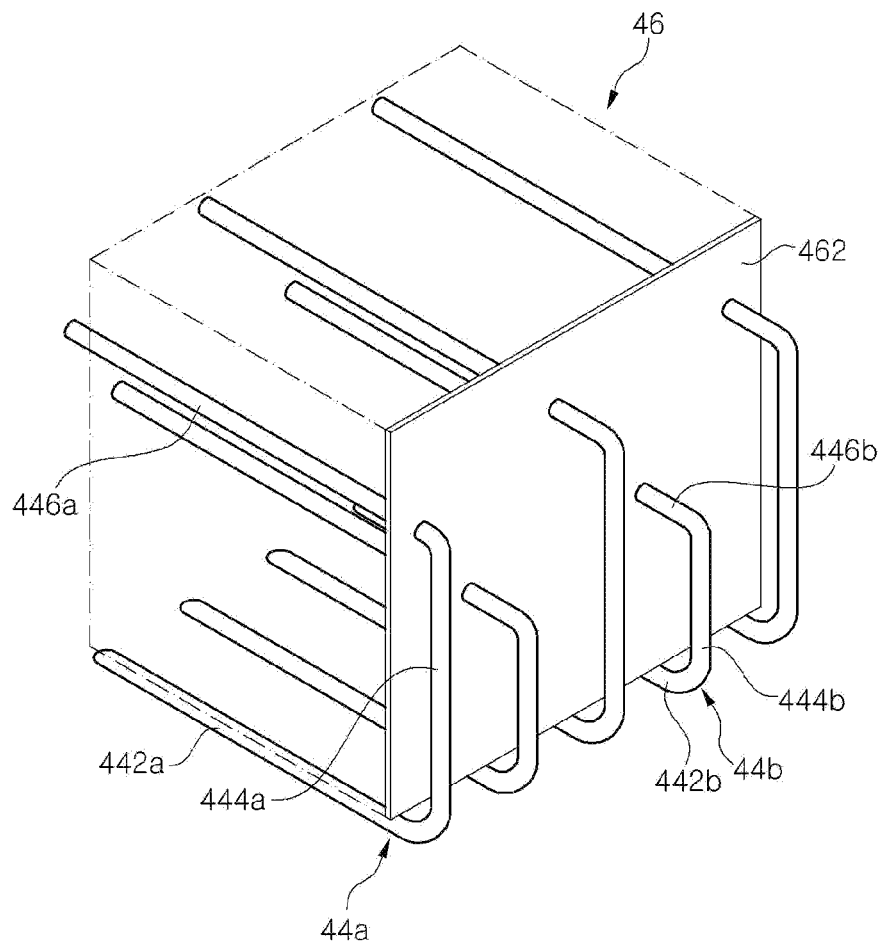
FIG. 8 is a perspective view of cooperative type heat pipes and a heat sink block of the heat sink unit.

FIG. 1 is a perspective view of an optical semiconductor-based lighting apparatus according to one embodiment of the present invention; FIG. 2 is a plan view of a light emitting module of FIG. 1, with an optical cover removed therefrom; FIG. 3 is a partially cut-away front view of the lighting apparatus according to the embodiment of the present invention; FIG. 4 is a partially cut-away side-sectional view of the lighting apparatus according to the embodiment of the present invention; FIG. 5 is a top view of a cooling fan and a heat sink unit shown in FIG. 3 and FIG. 4; FIG. 6 is a top view of a heat sink base on which heat pipes of a heat sink unit are arranged; FIG. 7 is a cross-sectional view taken along line I-I of FIG. 6; and FIG. 8 is a perspective view of cooperative type heat pipes and a heat sink block of the heat sink unit. In FIGS. 4 to 6, although some elements are indicated by different reference numerals with parentheses, it is noted that a certain element indicated by a reference numeral in parentheses includes an element indicated by another reference numeral outside the parentheses.

Referring to FIGS. 1, 3 and 4, the lighting apparatus according to this embodiment includes a light emitting module 10 and a housing 20. In addition, the lighting apparatus may include a heat sink unit 40 and a cooling fan 60 within the housing 20. Further, the lighting apparatus may include a power supply 80 within the housing 20 to supply electric power to the light emitting module 10.

The housing 20 may receive many heat dissipation elements for rapidly discharging heat from the light emitting module 10 to the outside. The heat dissipation elements may include a component(s) included in the heat sink unit 40 and, for example, a component(s) of an air cooling unit such as the cooling fan 60.

The housing 20 includes an upper housing section 22 and a lower housing section 24. The lower housing section 24 is provided at a lower end thereof with a circular open region, which is covered by the light emitting module 10. The heat dissipation elements are disposed above the light emitting module 10 within the housing 20, that is, at a rear side within the housing 20 of the light emitting module 10.

As described above, the lower end region of the lower housing section 24 having the light emitting module 10 mounted thereon generally has a circular shape corresponding to a general shape of the light emitting module 10. Thus, it should be understood that when the light emitting module 10 has a different shape than a circular shape, the lower end region of the lower housing section 24 may also have a different shape corresponding to the shape of the light emitting module.

A switching mode power supply (SMPS) may be used as the power supply. The SMPS 80 serves to convert AC current into DC current and supply the DC current to semiconductor optical devices of the light emitting module.

The lighting apparatus may further include a tilt variable holding unit 30, by which the lighting apparatus may be provided to the ceiling or the like at a desired angle.

Light Emitting Module 10

The light emitting module 10 is disposed in the open region at the lower end of the housing 20 to emit light downwards.

As clearly shown in FIG. 2, the light emitting module 10 includes a substantially circular PCB 14 and a plurality of semiconductor optical device 16 mounted on the PCB 14. The semiconductor optical devices 16 may be light emitting devices (LEDs). In this embodiment, the semiconductor optical devices 16 are arranged along a periphery of the PCB 14 on a circle (C) indicated by a dash-dot-dotted line, and the plural semiconductor optical devices 16 are arranged over most regions within the circle (C). In a central region of the PCB 14, the semiconductor optical device 16 is not placed in order to provide components and wires for operation of the semiconductor optical devices 16.

The PCB 14 may be composed of several arcuate unit PCBs. The PCB 14 may be a metal core PCB (MCPCB) or metal PCB (MPCB) based on a metal board having good thermal conductivity.

For example, a circular PCB 14 is provided to a substantially disk-shaped heat sink base 12 by attaching or fastening the PCB to the heat sink base 12. The heat sink base 12 is provided to cover the open region of the lower end of the housing 20. The air exhaust ports 3 are arranged at constant intervals along the periphery of the heat sink base 12 surrounding the circular PCB 14 and connect the interior and exterior of the housing 20. The heat sink base 12 may be formed of a metallic material such as copper or aluminum, which has good thermal conductivity. The optical cover is coupled to the heat sink base 12 to protect the semiconductor optical devices 14. In FIG. 1, there is shown an optical cover 18, part of which is cut-away to show light emitting devices 16 inside the housing. The air exhaust ports 12 are disposed in a substantially circular arrangement along an outer periphery of an installation region of the optical cover 18, and thus are exposed outside instead of being covered by the optical cover 18.

Although the PCB 14 is illustrated as being coupled to the heat sink base 12 in this embodiment, it can be contemplated that a circuit pattern of the PCB may be directly formed together with an insulation material on the heat sink base 12. Accordingly, although the heat sink base and the PCB have been illustrated as being separate elements, it should be noted that the PCB may be a component of the heat sink base.

Heat Sink Unit 20

As clearly shown in FIG. 3 and FIG. 4, the heat sink unit 40 is placed directly above the light emitting module 10 within the housing 20. In addition, the heat sink unit 40 includes a heat pipe structure 42, 44a, 44b and a heat sink block 46.

The heat pipe structure includes a plurality of heat pipes 42, 44a, 44b. The plurality of heat pipes 42, 44a, 44b receives a cooling fluid and is disposed to adjoin the heat sink base 12 such that the cooling fluid removes heat from the heat sink base 12.

The plurality of heat pipes 42, 44a, 44b receives a liquid such as water or alcohol in a reduced pressure state to remove heat from the heat sink base 12 in such a way that the liquid is converted to vapor by temperature elevation at one side and the vapor is converted back into the liquid through heat dissipation from the vapor at the other side.

Independent Type Heat Pipe and Cooperative Type Heat Pipe

The heat pipe structure includes independent type heat pipes 42 and cooperative type heat pipes 44a, 44b. The independent type heat pipes 42 perform heat dissipation independent of the heat sink block 46, and the cooperative type heat pipes 44a, 44b perform heat dissipation together with the heat sink block 46.

The independent type heat pipe 42 can be referred to as a horizontal type heat pipe, which is disposed horizontal to the heat sink base 12, or as an overall contact type heat pipe, the entire length of which adjoins an upper surface of the heat sink base 12. Further, the cooperative type heat pipe 44a, 44b can be referred to as a vertical type heat pipe, which is disposed vertical to the heat sink base 12, or as a partial contact type heat pipe, a lower length of which partially adjoins the upper surface of the heat sink base 12.

As shown in FIG. 3 to FIG. 8, each of the cooperative type pipes 44a, 44b includes a lower horizontal line section 442a or 442b, a vertical middle line section 444a or 444b and an upper horizontal line section 446a or 446b, which are defined by bending the corresponding pipe in a rectangular shape open at one side ("⊏") and are integrally formed with each other. Each of the lower horizontal line section 442a or 442b, the vertical middle line section 444a or 444b and the upper horizontal line section 446a or 446b has a straight line shape. Like the independent type heat pipes 42, the lower horizontal line section 442a or 442b horizontally adjoins the upper surface of the heat sink base 12.

As best shown in FIG. 8, the upper horizontal line section 446a or 446b is disposed to penetrate a plurality of heat sink plates 462 constituting the heat sink block 46. In this embodiment, the heat sink block 46 is provided by securing the plurality of heat sink plates 462 in a rectangular parallelepiped or cube-shaped arrangement. The heat sink plates 462 may be maintained in a block shape by disposing the plurality of upper horizontal line sections 446a, 446b to penetrate the heat sink plates 462 at different positions.

For the cooperative type heat pipes 44a, 44b at a left side of the heat sink block 46, each of the upper horizontal line sections 446a, 446b extends from the left side of the heat sink block 46 towards a right side thereof while penetrating the heat sink block 46. In addition, for the cooperative type heat pipes 44a, 44b at a right side of the heat sink block 46, each of the upper horizontal line sections 446a, 446b extends from the right side of the heat sink block 46 towards the left side thereof while penetrating the heat sink block 46.

As clearly shown in FIG. 8, the cooperative type heat pipes 44a, 44b are classified into a first cooperative type heat pipe 44a and a second cooperative type heat pipe 44b according to the height of the heat pipes penetrating the heat sink block 46 or the lengths of the vertical middle line sections 444a, 444b. The first cooperative type heat pipe 44a has a vertical line section 444a, which has a longer vertical length than a vertical line section 444b of the second cooperative type heat pipe 44b. Thus, the height of the upper horizontal line section 446a of the first cooperative type heat pipe 44a penetrating the heat sink block 46 is higher than the height of the lower horizontal line section 446b of the second cooperative type heat pipe 44b penetrating the heat sink block 46.

Accordingly, preferably, the first cooperative type heat pipe 44a and the second cooperative type heat pipe 44b are alternately arranged. Arrangement of the first and second cooperative type heat pipes 44a, 44b having different heights may prevent concentration of heat transfer on one region of heat sink block 46, thereby providing further improved heat dissipation of the heat sink unit 40 with respect to the light emitting module 10.

Pattern of Heat Pipe Structure

As best shown in FIG. 5 and FIG. 6, each of the independent type or overall contact type heat pipes 42 is defined by two or more line sections formed by bending the heat pipe and adjoins the upper surface of the heat sink base 12.

In this embodiment, each of the independent type heat pipes 42 integrally includes two line sections, that is, a straight inner line section 422 placed near a virtual center line H of the heat sink base 12 to be parallel to the center line H and a curved peripheral line section 424.

The peripheral line section 424 has a curved shape corresponding to an arc of a circle constituting a peripheral arrangement of the semiconductor optical devices 16. The peripheral line section 424 of the independent type or overall contact type heat pipe 42 participates in heat dissipation from an inner region thereof and provides a significant contribution to heat dissipation from a region between a region of the peripheral line section 424 and an outer periphery of the heat sink base 12. As the peripheral line section 424 is formed corresponding to the shape and position of the peripheral arrangement of the semiconductor optical devices 16, heat dissipation may be further improved. Here, the peripheral arrangement of the semiconductor optical devices 16 may be present between the peripheral line section 424 and an outer edge of the heat sink base 12.

In this embodiment, four independent type or overall contact type heat pipes 42 having the same shape are dispose on the heat sink base 12. Here, two independent type or overall contact type heat pipes 42, 42 are placed at the left side of the center line H such that ends of two inner line sections 422, 422 thereof face each other on the same line, and such that two peripheral line sections 424, 424 are symmetrical to each other with two ends of the two peripheral line sections 424, 424 facing each other in a separated state. The peripheral line section 424 is formed corresponding to the shape and position of the peripheral arrangement of the semiconductor optical devices 16.

Similarly, two independent type or overall contact type heat pipes 42, 42 are placed at the right side of the center line H such that ends of two inner line sections 422, 422 thereof face each other on the same line, and such that two peripheral line sections 424, 424 are symmetrical to each other with two ends of the two peripheral line sections 424, 424 facing each other in a separated state. As such, four independent type or overall contact type heat pipes 42 may be disposed in a bilaterally and vertically symmetrical arrangement on the heat sink base 12.

Such shapes and arrangement of the independent type or overall contact type heat pipes 42 allow the heat pipes to be disposed as wide as possible, with the linear lower horizontal line sections 442a, 442b of the cooperative type or partial contact type heat pipes 44a, 44b concentrated on one region of the heat sink base 12, preferably on the central region of the heat sink base 12.

At the left side of the upper surface of the heat sink base 12, a pair of independent type or overall contact type heat pipes 42, 42 is disposed such that two inner line sections 422, 422 thereof have distal ends facing each other on the same straight line and two peripheral line sections 424, 424 thereof are separated from each other while facing each other. The lower horizontal line sections 442a, 442b of the plurality of cooperative type or partial contact type heat pipes 44a, 44b (see FIG. 8) are disposed parallel to each other between the pair of independent type or overall contact type heat pipes 42.

In addition, at the right side of the upper surface of the heat sink base 12, another pair of independent type or overall contact type heat pipes 42, 42 is disposed such that two inner line sections 422, 422 thereof have distal ends facing each other on the same straight line and two peripheral line sections 424, 424 thereof are separated from each other while facing each other. The lower horizontal line sections 442a, 442b of the plurality of cooperative type or partial contact type heat pipes 44a, 44b (see FIG. 8) are disposed parallel to each other between the pair of independent type or overall contact type heat pipes 42.

At this time, each of the lower horizontal line sections 442a, 442b has an end between the two peripheral line sections 424, 424 of the independent type or overall contact type heat pipes 42, 42 and linearly extends towards the center of the heat sink base.

According to one embodiment of the invention, the cooperative type or partial contact type heat pipes 44 may cool the light emitting module 10 with high heat dissipation performance in cooperation with the light emitting module 10. To this end, the lower horizontal line sections 442a, 442b of the cooperative type heat pipes 44 are broadly arranged at high density on the heat sink base 12 on an upper or rear side of the light emitting module 10, and the independent type heat pipes 42 are disposed to entirely contact some regions of the heat sink base, on which it is difficult to dispose the lower horizontal line sections 442a, 442b, in particular, on some region of the periphery of the heat sink base 12 and on the central region thereof. Such a structure allows the heat pipes 42, 44 to be widely and densely disposed substantially over the entirety of the heat sink base 12 on the rear side of the light emitting module 10 without complicating the design of the heat pipes.

Referring to FIG. 7, the lower horizontal line sections 442 of the independent type heat pipes 42 and the cooperative type heat pipes 44a or 44b are secured to the upper surface of the heat sink base 10 by the pipe securing unit 120. The pipe securing unit 120 includes lower securing plates 121, each of which is formed with grooves 121a receiving at least part of each of the lower horizontal line sections 442 of the independent type heat pipes 42 and the cooperative type heat pipe 44a or 44b, and upper securing plates 122, which are secured to the upper surfaces of the lower securing plates and cover the grooves 121a.

Referring again to FIG. 6, the pipe securing unit 120 includes a central pipe securing unit 120a and a peripheral pipe securing unit 120b. The central pipe securing unit 120a is disposed at the central region of the heat sink base 12 to secure opposite ends of the lower horizontal line sections 442a, 442b and the inner line sections 422 of the independent type heat pipe 42. The peripheral pipe securing unit 120b is disposed along the periphery of the heat sink base 12 to secure middle sections of the lower horizontal line sections 442a, 442b and the ends of the peripheral line sections 424 of the independent type heat pipes 42.

Application of Air Cooling Structure

As best shown in FIG. 3 and FIG. 4, the SMPS 80 is placed at an upper portion inside the housing 20. Since the SMPS 80 generates large amounts of heat during operation, an air cooling structure is disposed within the housing 20 to prevent excessive increase in temperature within the housing 20. The air cooling structure will be described in detail hereinafter. The air cooling structure may be used for air cooling not only the SMPS 80, but also various components such as the heat sink unit or the light emitting module within the housing 20.

A cooling fan 60 is disposed between the SMPS 80 and the heat sink unit 40. In addition, the housing 20 is formed at an upper lateral side thereof with a plurality of air suction ports 2 through which external air is suctioned into the housing 20. Each of the air suction ports 2 may have a slit shape and may be disposed in a grill type arrangement together with other air suction ports 2. Further, the air suction ports 2 may be located above the cooling fan 60.

Further, the SMPS 80 may be suspended a predetermined distance from the ceiling of the housing 20 by a holding member. A space between the ceiling of the housing 20 and the SMPS 80 assists in cooling the SMPS 80 by allowing air to be brought into direct contact with an upper surface of the SMPS 80. Particularly, when external air is suctioned to cool the SMPS 80 as in the present invention, all of the upper, side and lower surfaces of the SMPS 80 are separated from inner walls of the housing 20 to allow the external air to be brought into contact with all surfaces of the SMPS 80.

The air suction ports 2 may be formed adjacent the SMPS 80 in a lateral direction. Air exhaust ports 3 are formed on or near the periphery of the light emitting module 10 at a lower side of the housing 20.

Further, a plurality of air exhaust ports 3 is formed along the periphery of the light emitting module 10 at a lower end of the housing 20 to exhaust external air from the housing. The air exhaust ports 3 may be formed on the heat sink base 12 of the light emitting module 10, which supports the PCB 14 having the semiconductor optical devices 16 mounted thereon, or formed on the lower end of the housing 20 around the light emitting module 10.

The plurality of air exhaust ports 3 may be formed in a certain arrangement near the lower end of the housing 20, specifically, on a peripheral region of the heat sink base 12 at the lower end of the housing 20. In this embodiment, the air exhaust ports 3 are formed in a substantially slit shape along an annular peripheral region of the heat sink base 12 and are arranged in constant intervals. As the air exhaust ports 3 are formed on the annular peripheral region of the heat sink base 12, the air exhaust ports 3 can be advantageously placed at intended locations simply by mounting the PCB and the semiconductor optical devices on the heat sink base 12 and assembling the light emitting module 10 to the open region of the lower end of the housing 20.

The air suction ports 2 are placed above the cooling fan 60. A distance between the cooling fan 60 and the upper end of the housing 20, that is, the thickness of a rear space of the cooling fan 60 is greater than the thickness of the cooling fan 60. If the thickness of the cooling fan 60 is greater than the thickness of the rear space of the cooling fan, cold air suctioned into the housing through the air suction ports 2 is blown downwards without sufficiently cooling the SMPS 80, thereby making it difficult to achieve effective cooling of the SMPS 80.

According to this embodiment, the cooling fan 60 placed below the SMPS 80 suctions cold air from outside through the air suction ports 2 such that the suctioned air removes heat generated from the SMPS 80 and is transferred upwards by convection while being forcibly blown downwards by the cooling fan. Then, the cold air cools the light emitting module 10 in cooperation with the heat sink unit 40 and is then finally discharged outside through the air exhaust ports 3 disposed near the lower end of the housing 20. If heat generated from the SMPS 80 is transferred to the inner upper side of the housing and remains therein, there can be severe failure or error in operation of the lighting apparatus.

The cooling fan 60 may be configured to rotate in the clockwise or counterclockwise direction. When the cooling fan 60 rotates in the counterclockwise direction, the air exhaust ports 3 serve as the air suction ports to allow air suction therethrough, and the air suction ports 2 serve as the air exhaust ports to discharge heated air to the outside from the housing therethrough.

By application of the air cooling structure, the ratio of the thickness (t) of the heat sink plate of the heat sink block 46 to the distance (g) between the heat sink plates is considered one important factor determining heat dissipation performance of the lighting apparatus.

With the heat sink plates 462 having a constant thickness, heat dissipation performance can be substantially linearly improved even when the distance between the heat sink plates 462 is increased while increasing the number of heat sink plates 462 until the number and distance between the heat sink plates 462 reach predetermined values. However, when the distance between the heat sink plates 462 decreases below a predetermined value, thermal interference and heat lag occur between adjacent heat sink plates 462, causing deterioration in heat dissipation performance of the lighting apparatus. In addition, when the cooling fan 60 is used as in this embodiment, too narrow a distance between the heat sink plates 462 can cause inefficient supply of air to gaps between the heat sink plates 462 upon operation of the cooling fan 60, making it difficult to achieve improvement in heat dissipation performance. Advantageously, the ratio of the thickness of the heat sink plate to the distance between the heat sink plates is in the range from 1:1.5 to 1:5.

The air cooling structure including the cooling fan 60 participates in heat dissipation of the light emitting module 10 and in cooling of the SMPS 20 in cooperation with the heat sink unit 40.

Meanwhile, the heat sink block 46 and the heat sink plates 462 of the heat sink block are separated at the lower ends thereof from the independent type heat pipes 42 and the lower horizontal line sections of the cooperative type heat pipes 44a, 44b. Accordingly, the gaps between the heat sink plates 462 of the heat sink block 46 are open at the lower ends of the heat sink plates 462, allowing air blown by the cooling fan 60 to pass through the lower ends of the heat sink block 46 through the gaps between the heat sink plates 462 and to be delivered to the upper surface of the heat sink base 12.

A pair of cooling fans 60 is provided directly above a pair of heat sink blocks 46, 46. Each of the cooling fans 60 is located between each of the heat sink blocks 46 and the SMPS 80. In the SMPS 80, components generating large amounts of heat are disposed at a lower region thereof adjacent the cooling fans 60.

Figure 9:
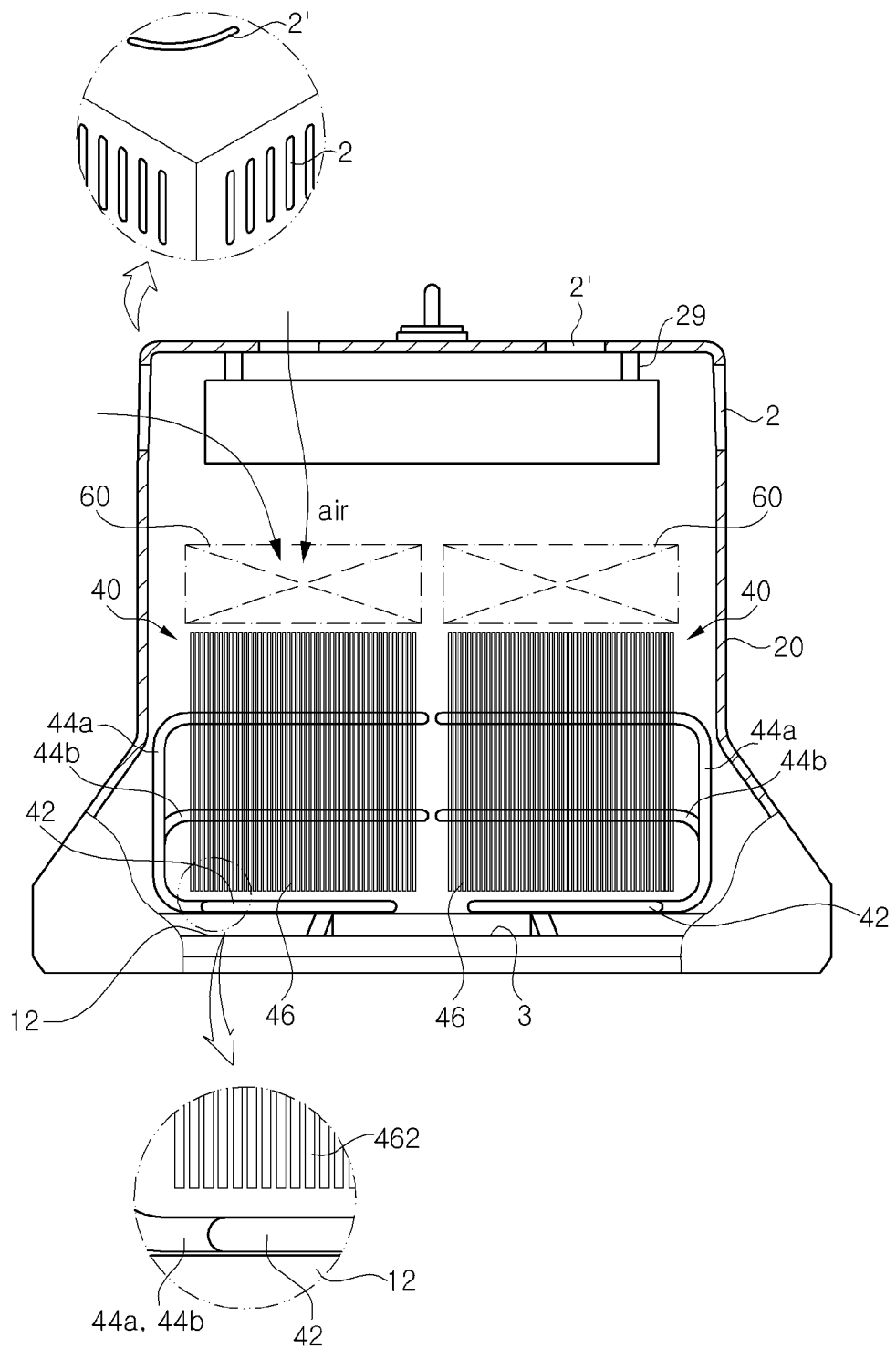
FIG. 9 is a view of the optical semiconductor-based lighting apparatus including a modified air-cooling structure.

FIG. 9 shows modification of the air cooling structure.

Referring to FIG. 9, the SMPS 80 is separated from the ceiling of the housing 20 by a suspended holding member 29. Further, the ceiling surface of the housing 20 is formed with air suction ports 2' in addition to the air suction ports 2 formed in the upper side surface of the housing. During operation of the cooling fan 60, external air is suctioned into the housing not only through the air suction ports 2 formed in the side surface of the housing 20 but also through the air suction ports 2' formed in the ceiling surface of the housing 20. As a result, according to the present embodiment, the space above the SMPS 80 is cooled by the external air suctioned through the air suction ports 2' of the ceiling surface of the housing without suffering from severe heat lag, so that the SMPS 80 may be more effectively cooled.

Tilt Variable Holding Unit 30

As best shown in FIG. 1, the tilt variable holding unit 30 includes a bracket secured to the ceiling or the like. The bracket includes a horizontal shoulder 322 and a pair of arms 324, 324 vertically extending downwards from both sides of the shoulder 322. The pair of arms 324, 324 is hingably coupled at lower sides thereof to shafts 342 protruding from both sides of the lower end of the housing 20 or from both sides of the lower end of the heat sink base 12.

The shoulder 322 is provided at the center thereof with a fastening member 326, which is secured to the ceiling or the like by, for example, fastening or the like. The shafts 342 may be integrally formed with both sides of the heat sink base 12. For example, when forming the heat sink base 12 by die casting, the structure of the shafts 342 integrally formed with the heat sink base 12 may eliminate separate design for installation of the shafts on the housing 20 and may prevent damage of the housing near the shafts 342 due to rotation of the housing 20 and the lighting apparatus.

When the bracket is secured to the ceiling or the like by the fastening member 326, the housing 20 may be rotated about the shafts 242, 242 by external force. For example, a friction or latch mechanism may be used in order to allow rotation of the housing 20 to be stopped at a certain angle.

Application of Anti-Fouling Unit

Figure 10:
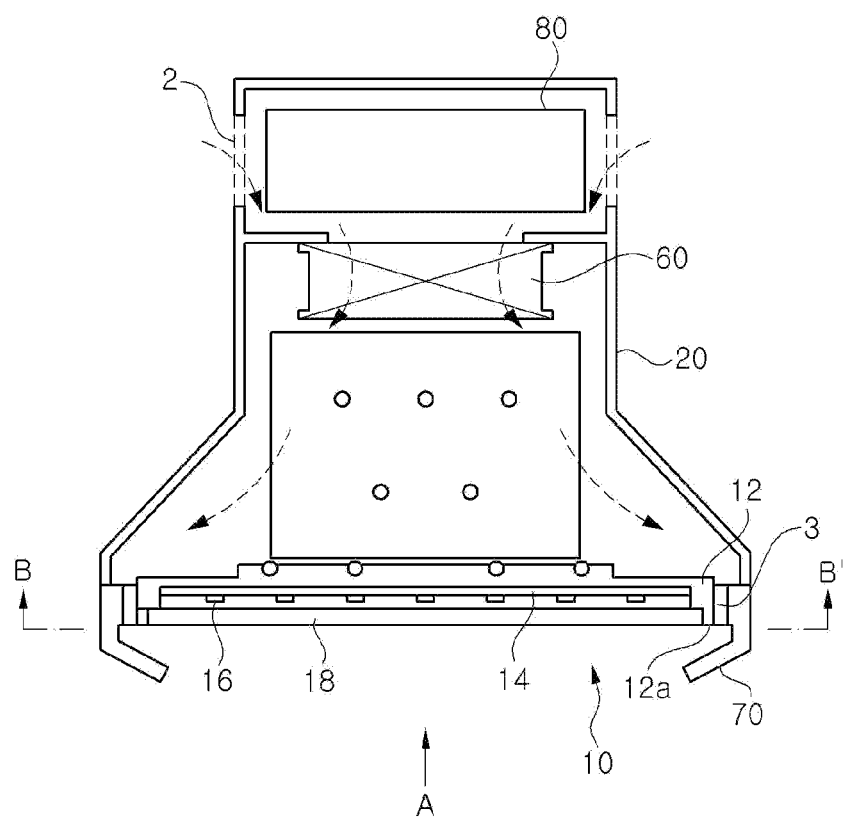
FIG. 10 and FIGS. 11(*a*) and (*b*) are views of the optical semiconductor-based lighting apparatus, which includes an anti-fouling unit according to one embodiment of the present invention.
Figure 11:
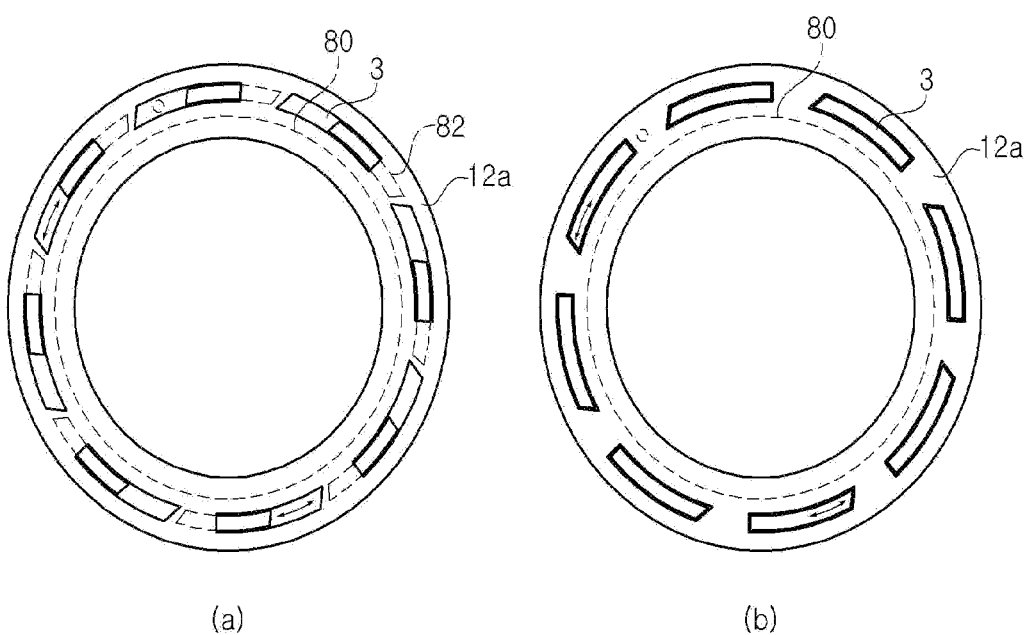

FIG. 10 is a schematic side-sectional view of an optical semiconductor-based lighting apparatus, which includes an anti-fouling unit, according to another embodiment of the present invention, and FIGS. 11(a) and 11(b) are cross-sectional views taken along line B-B' of FIG. 10 in a direction of arrow A, showing two air discharge operation modes.

Referring to FIG. 10, as in the lighting apparatus described above, the lighting apparatus according to this embodiment includes a light emitting module 10 disposed in the lower open region of a housing 20 and includes a plurality of semiconductor optical devices 16. A heat sink base 12 is mounted on the housing 20 to cover the lower open region of the housing 20 and is provided at a lower side thereof with a PCB 14 coupled thereto. In addition, semiconductor optical devices 16 are mounted on the PCB 14 and an optical cover 18 is mounted on the heat sink base 12.

The optical cover 18 is placed directly under the PCB 14 and covers optical devices 16. The housing 20 has an SMPS 80 disposed in an upper inner space of the housing. It should be noted that the SMPS 80 may be disposed together with other components in this space.

As in the above embodiment, a plurality of air exhaust ports 3 is formed around the optical cover 18 at the lower side of the housing 20. The air exhaust ports 3 are arranged along the periphery of the optical cover 18. In addition, an anti-fouling structure 70 is disposed near the air exhaust ports 3 to guide air flow discharged through the air exhaust ports 3 to a surface of the optical cover 18. Further, the housing 20 is provided therein with at least one cooling fan 60, which forcibly suctions external air through the air suction ports 2 formed at the upper lateral sides of the housing 20 and discharges the external air to the outside through the air exhaust ports 3.

While being forcibly suctioned into and discharged from the housing 20 by the air cooling fan 60 in a direction indicated by the dotted arrow, the external air removes heat from the housing 20 and prevents foreign matter from being introduced into or adhered to the housing 20 together with the anti-fouling structure 70. The anti-fouling structure 70 guides the air discharged through the air exhaust ports 3 to cover the lower open end of the housing 20 and the optical cover 18 mounted thereon, thereby blocking foreign matter and pollutants in an air curtain manner. Further, the air may serve to remove the foreign matter and pollutants from the optical cover 18 by blowing the foreign matter and pollutants.

The cooling fan 60 cools heat generating components such as the semiconductor optical device 16 and the SMPS 80 by forcibly suctioning and discharging external cold air from the housing 20. The air suction ports 2 are formed in an elongated slit shape along the lateral side of the housing 20 corresponding to the SMPS 80 located at an inner upper housing section 20, and air suctioned into the housing through these air suction ports 2 first participates in cooling the SMPS 80.

Although not shown in the drawings, the lighting apparatus may further include a dust filter, which covers the air suction ports 3 to block foreign matter such as dust while allowing only clean air to be suctioned into the housing. It can be contemplated that a particular filter such as a HEPA filter, SEPA filter, and the like may be used as the dust filter to block not only dust but also harmful substances including bacteria.

As described in the above embodiment, a heat sink unit 40 including a heat sink block 46 and heat pipes 44 is disposed directly below the cooling fan 60. Although not shown in the drawings, the heat sink unit 40 may include the same or similar kind, structure and arrangement of heat pipes to those of the embodiment described above.

Meanwhile, the anti-fouling structure 70 guides air discharged through the air exhaust ports 3 placed around the optical cover 18 to flow towards the center of the optical cover 18, thereby preventing introduction or adhesion of foreign matter. In this embodiment, the anti-fouling structure 70 has a vent guide structure, which is slanted towards the center of the optical cover 18 to guide the discharged air towards the center of the optical cover 18.

In this embodiment, a plurality of air exhaust ports 3 is disposed in a circular arrangement along an annular peripheral region 12a of the heat sink base 12 near the PCB 14. At a rear side of the annular peripheral region 12a of the heat sink base 12, a ring-shaped air exhaust port adjusting member 80 may be placed as indicated by a dotted line in FIG. 11. The air exhaust ports adjusting member 80 may include slots 82, the number and shape of which corresponds to those of the air exhaust ports 3, and may be rotated in the clockwise or counterclockwise direction at the rear side of the annular peripheral region 21a. Therefore, it is possible to adjust an overlapping area between the slots 82 and the air exhaust ports 3, and the discharge speed and amount of air may be adjusted by adjusting the overlapping area.

Figure 12:
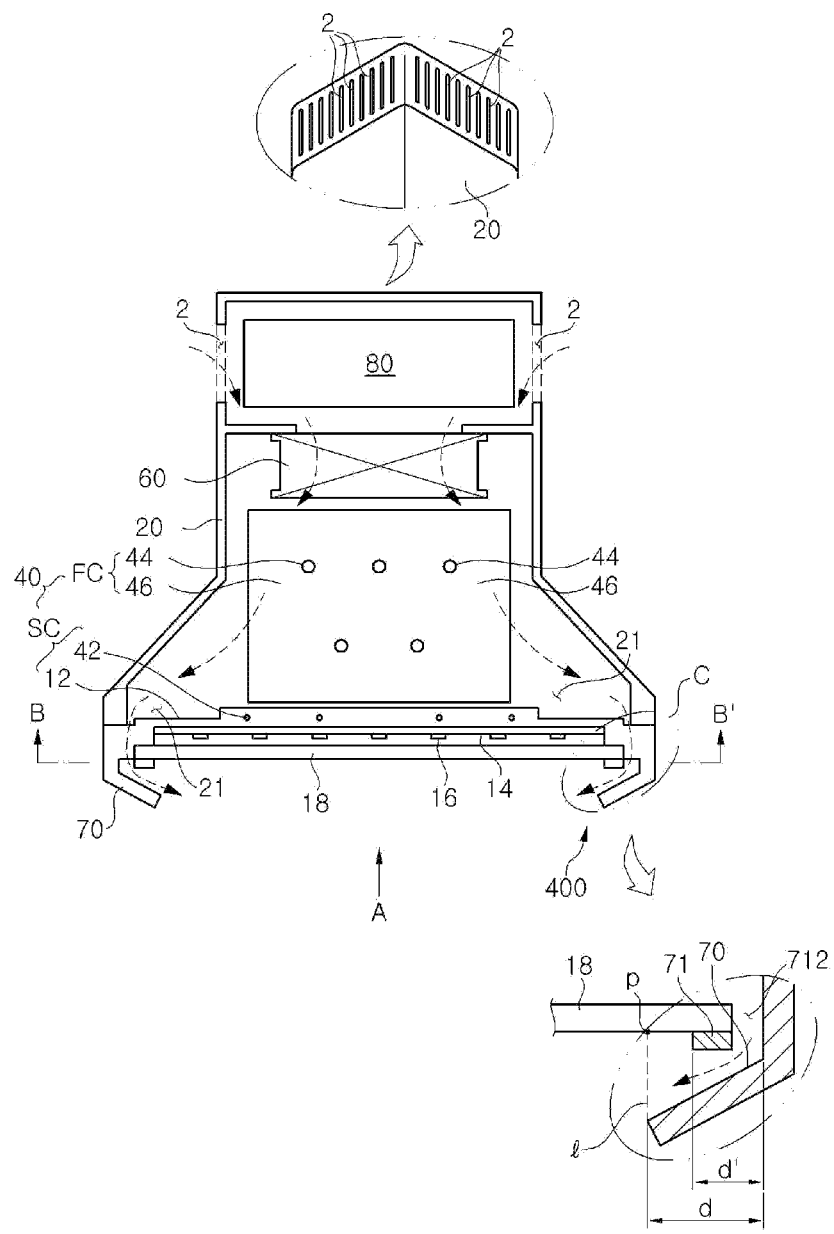
FIG. 12 is a cross-sectional view of the optical semiconductor-based lighting apparatus, which includes an anti-fouling unit according to another embodiment of the present invention.
Figure 13:
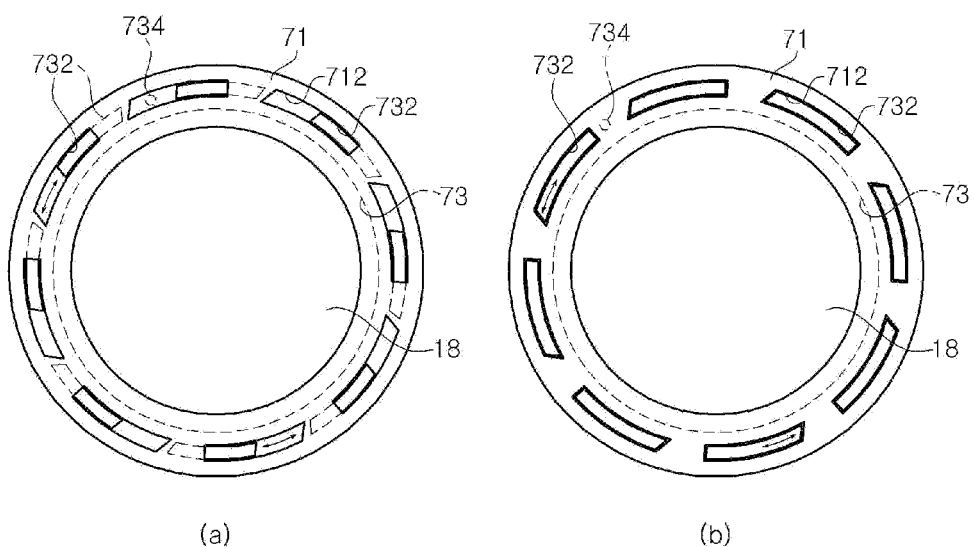
FIGS. 13(*a*) and (*b*) are views of the optical semiconductor-based lighting apparatus, when viewed in a direction of arrow A from line B-B' of FIG. 12.
Figure 14:
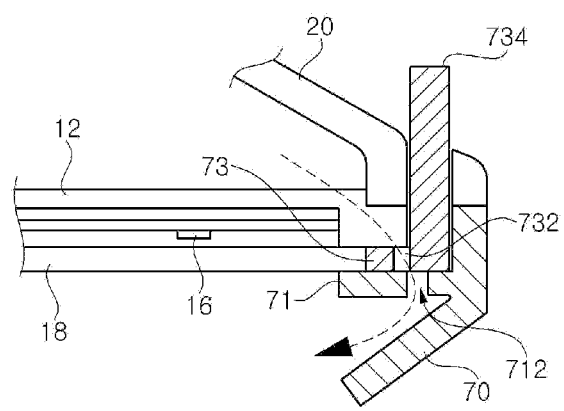
FIG. 14 and FIG. 15 are views of other embodiments of the anti-fouling unit of FIG. 12 and FIG. 13.
Figure 15:
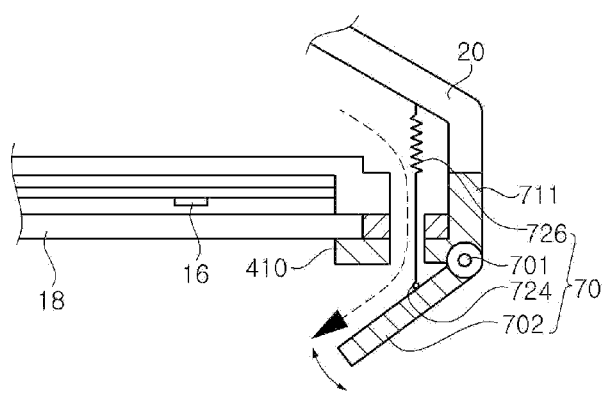

FIG. 12 is a cross-sectional view of an optical semiconductor-based lighting apparatus, which includes an anti-fouling unit, according to another embodiment of the present invention, FIG. 13 is a view of the optical semiconductor-based lighting apparatus viewed in a direction of arrow A from line B-B' of FIG. 12, and FIG. 14 and FIG. 15 are views of other embodiments of the anti-fouling unit of FIG. 12 and FIG. 13.

Referring to FIG. 12, as in the above embodiment, the optical semiconductor-based lighting apparatus includes an anti-fouling structure (that is, anti-fouling unit), which removes foreign matter from portions near the semiconductor optical devices 16, particularly, from the optical member 18, by discharging air towards the opening 21 of the housing 20 in which the semiconductor optical devices 16 are placed. The housing 20 is provided at one side, particularly, at a side of the opening 21, with a plurality of semiconductor optical devices 16. The optical member 18 is mounted on the opening 21 of the housing to face the semiconductor optical devices 16. Further, the housing 20 receives various components including an SMPS 80 and the like therein.

The anti-fouling unit is provided to the opening 21 of the housing 20 along the periphery of the optical member 18 and serves to change a direction of air (in a direction indicated by the dotted arrow), which is forcibly blown from the interior of the housing, from the outside of the housing 20 to a front side of the optical member 18 in order to prevent foreign matter from being introduced into or adhered to the optical member 18 and/or in order to remove adhered foreign matter from the optical member 18.

In addition, the optical semiconductor-based lighting apparatus includes an air cooling unit for air cooling of main components including the semiconductor optical devices 16 and the SMPS 80 within the housing using air, and a heat sink unit 40, which thermally contacts the semiconductor optical devices 16 and a PCB or a heat sink base supporting the semiconductor optical devices 16 to remove heat therefrom. The air cooling unit and the heat sink unit perform heat dissipation in cooperation with each other.

The air cooling unit includes a cooling fan 60 as described in the above embodiment. The heat sink unit may include heat pipes and a heat sink block as described in the above embodiment.

The cooling fan 60 cooperates with the anti-fouling unit as described above while suctioning external air into the housing 18 and forcibly blowing the air towards the exhaust ports formed along the periphery of the optical member 18, thereby preventing foreign matter from being accumulated on the front side of the optical member 18. The cooling unit is configured to promote cooling of a cooling fluid with respect to the semiconductor optical devices while circulating along a predetermined pattern of fluid passageways.

Within the housing 20, the cooling unit including the cooling fan 60, the heat sink unit 40, and the optical member 18 are arranged in this order in a direction of air towards the outside of the housing 20.

Assuming that an upper side of FIG. 12 is the ceiling to which the optical semiconductor-based lighting apparatus is provided, the air cooling unit or the cooling fan 60 may remove heat from the housing 20 and the anti-fouling unit may prevent foreign matter from being introduced into or adhered to the housing 20, while air is forcibly suctioned and discharged in the direction indicated by the dotted arrow by the air cooling unit or the cooling fan 60.

Next, the configuration and operation of each of the air cooling unit, heat sink unit 40 and anti-fouling unit will be described in more detail.

First, in the air cooling unit, the cooling fan 60 cools heat generating components such as the semiconductor optical device 16 and the SMPS 80 by forcibly suctioning and discharging external cold air from the housing 20. Here, the cooling fan 60 suctions the external air through the air suction ports 2 formed along an outer surface of the housing 20 corresponding to the SMPS 80 received at one side of the housing 20, and discharges the external air towards the optical member 18. As shown in the drawings, the air suction ports 2 may be composed of a plurality of slits. Here, although not shown in the drawings, a detachable dust filter may be provided to the inner surface of the housing 20, on which the air suction ports 2 are formed. It can be contemplated that a particular filter such as a HEPA filter, SEPA filter, and the like may be used as the dust filter to block not only dust but also harmful substances including bacteria.

Meanwhile, the heat sink unit 40 is configured to embody cooling operation through contact thermal transfer with the semiconductor optical devices 16, the PCB 14 and the heat sink base 12 using a cooling fluid as described above. Thus, the heat sink unit includes a first cooling assembly (FC) adjacent the cooling fan 60 of the air cooling unit, and a second cooling assembly (SC) adjacent the semiconductor optical devices 16.

The first cooling assembly (FC) includes a first heat pipe 44 and a heat sink block 46 disposed adjacent the cooling fan 60 to be rapidly cooled by air suctioned into the housing. The first heat pipe 44 receives a cooling fluid, which is circulated by heat, and has a bent structure. The heat sink block 46 includes a plurality of metal heat sink plates separated at constant intervals from each other. The first heat pipe 44 is disposed such that one side of the first heat pipe 44 continuously penetrates the metal heat sink plates of the heat sink block 46. Further, the other side of the first heat pipe 44 may contact the heat sink base 12, which is thermally connected to the semiconductor optical devices 16.

The arranged direction and structure of the first heat pipe 44 may be designed to allow the cooling fluid to cool the heat sink block 46 and surroundings of the heat sink plates in the heat sink block while passing through as many points as possible for a long time.

The second cooling assembly (SC) is provided to the heat sink base 12. The semiconductor optical devices 16 and the PCB 14 having the semiconductor optical devices mounted thereon are disposed on a front side of the heat sink base 12 facing the optical member 18. The second cooling assembly (SC) includes the heat sink base 12 and a second heat pipe 42, which contacts the heat sink base 12. The second heat pipe 42 may be buried in the heat sink base 12 as shown in the drawings, or may be exposed upwards from a rear side of the heat sink base 12 like the independent type heat pipe of the aforementioned embodiment. The heat sink base 12 may be a single metal plate or a stack structure of two or more metal plates. Here, the metal plate is advantageously made of copper or aluminum, which exhibit excellent thermal conductivity. In the stack structure, at least one of the two metal plates is advantageously formed with grooves or holes in a pattern corresponding to the pattern of the second heat pipe, thereby enabling the second heat pipe 42 to penetrate both sides of the heat sink base 12 or to be securely held in the heat sink base 12.

Here, a cooling fluid received in the heat pipe 42 or 44 may be any material including alternative refrigerants to Freon such as HFC 134a and the like, which provide stable cooling performance without providing any substantial effect upon the environment.

Meanwhile, as described above, the anti-fouling unit guides air discharged towards the periphery of the optical member 18 to flow towards the front center of the optical member 18, thereby preventing introduction or adhesion of foreign matter. The anti-fouling unit may include a first ring 71 and a vent guide 70.

As best shown in FIGS. 12 and 13, the first ring 71 is coupled to the optical member 18 along the periphery of the opening of the housing 20 and is formed with a plurality of first slits 712 parallel to the periphery of the optical member 18. As best shown in FIGS. 12 and 14, the vent guide 70 is formed along an outer periphery of the first ring 71 such that a leading end of the vent guide 70 slantly extends towards the optical member 18 to define an acute angle with respect to the optical member 18.

Accordingly, with the structure as described above, the vent guide 70 changes the direction of air to be inclined with respect to the optical member 18 when discharged from the housing 20, so that the air may serve as an air curtain which blocks introduction or adhesion of foreign matter, while being forcibly suctioned into the housing 20 through the air suction ports 2 and discharged through the plurality of first slits 712.

As shown in FIG. 13 to FIG. 15, the anti-fouling unit may further include a second ring 73, which is terminated at the first ring 71 and may be rotated in the clockwise or counterclockwise direction along the periphery of the optical member 18.

The second ring 73 is disposed along the outer periphery of the optical member 18 and terminated at the first ring 71. In addition, the second ring 73 is formed with a second slit 732 having a shape corresponding to that of the first slit 712. The second ring 73 is configured to rotate in the clockwise or counterclockwise direction along the outer periphery of the optical member 18 with respect to the first ring 71.

Here, a distance (d) from a point (p) at which a virtual line (Λ) extending from an end of the vent guide 70 meets the optical member 18 to the outer periphery of the opening may be greater than or equal to a distance (d') from an inner periphery of the first ring 71 to the outer periphery of the opening.

Here, the distance (d') with respect to the distance (d) may be a limit for embodying an effect of preventing introduction or adhesion of foreign matter.

Further, the second ring 73 may further include a protrusion 734 to rotate in the clockwise or counterclockwise direction along the periphery of the optical member 18, as shown in FIG. 3.

In other words, the protrusion 734 is formed to protrude in the second slit 734 and between adjacent second slits 732, and has a distal end exposed outside from the housing 20. Although not shown in the drawings, the exposed end of the protrusion 734 is reciprocatably connected to a component such as a gear or a link outside the housing 20 to adjust the discharged amount of air while reciprocating, as shown in FIGS. 13(a) and 13 (b).

Further, as shown in FIG. 15, the vent guide 70 may be adjusted in terms of slant angle with respect to the optical member 18. Here, reference numeral 711 indicates a coupling portion of the first ring.

That is, the vent guide 70 includes a plurality of guide pieces 702 hingably coupled to the coupling portion via hinges 701, first wires 724 connected to the respectively guide pieces 702, and resilient members 726 each connected from the first wire 724 to the housing 20, such that the guide pieces 702 are pivoted according to the quantity and pressure of air discharged from the housing to allow adjustment of the slant angle of the vent guide 70 through resilient deformation of the resilient members.

In an alternative embodiment, the vent guide 70 includes a plurality of guide pieces 702, each of which is connected to a first wire 724, and a separate wire connected to the first wire 724. The separate wire extends to the outside of the housing 20 and is wound around a spool, which can be rotated in the clockwise or counterclockwise direction by a motor, in order to allow remote control of the vent guide.

As described above, the present invention provides an optical semiconductor-based lighting apparatus, which may prevent deterioration in quantity of light by blocking foreign matter and may solve the problem of heat generation within the housing.

It should be understood that various modifications and application can be made by a person having ordinary knowledge in the art without departing from the scope and spirit of the present invention.

Modifications

Next, modifications of the optical semiconductor-based lighting apparatus will be described.

Figure 16:
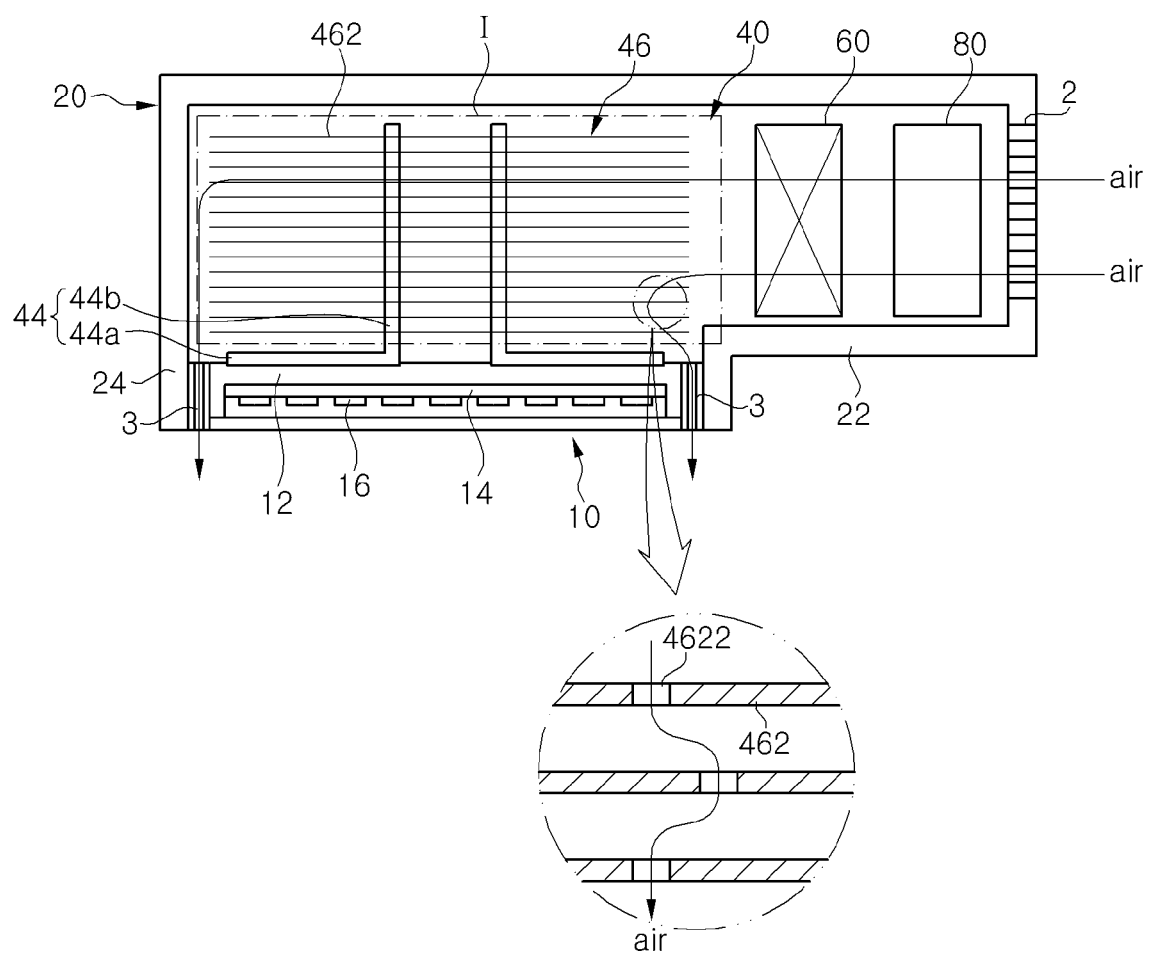
FIG. 16 is a cross-sectional view of modification of the optical semiconductor-based lighting apparatus according to the present invention.

First, referring to FIG. 16, the optical semiconductor-based lighting apparatus according to this modification includes a light emitting module 10 and a housing 20. Further, the optical semiconductor-based lighting apparatus includes a heat sink unit 40, a cooling fan 60, and a power supply 80 within the housing 20.

The housing 20 includes an upper horizontal housing section 22 and a lower vertical housing section 24. The light emitting module 10 is disposed in an open region at the lower end of the lower housing section 24 to emit light downwards In addition, the heat sink unit 40 is disposed above the light emitting module 10 in the lower housing section 24. Further, the cooling fan 60 and the power supply 80 are placed in the upper housing section 22. As specifically described below, the lower housing section 24 intersects the upper housing section 22 to form an intersection region I at the middle of the housing 20, as indicated by a dash-dot-dotted line. In the intersection region I, a heat sink block 46 of the heat sink unit 40 is placed such that a lateral side of the heat sink unit 46 faces the cooling fan 60 and a lower side of the heat sink unit 46 faces heat pipes 44 and a heat sink base 12 of the heat sink unit 40.

The power supply 80 may be realized by a switching mode power supply (SMPS), which serves to convert AC current into DC current and supply the DC current to optical semiconductor devices in the light emitting module 10. Since the power supply 80 such as the SMPS generates large amounts of heat during operation, the lighting apparatus according to this embodiment includes not only the heat sink unit 40 but also other components including a cooling fan 60 within the housing 20 in order to prevent temperature increase caused by the power supply 80.

As described above, the lower end region of the lower housing section 24, on which the light emitting module 10 is mounted, has a substantially circular shape corresponding to a general shape of the light emitting module 10. Obviously, when the light emitting module 10 has a different shape other than the circular shape, the lower end region of the lower housing section 24 also has a different shape corresponding thereto.

The upper housing section 22 is formed at a rear end thereof with a plurality of air suction ports 2 through which external air is suctioned into the housing. Each of the air suction ports 2 may have a slit shape and may be disposed in a grill type arrangement together with other air suction ports 2.

Further, a plurality of air exhaust ports 3 is formed along the lower end of the lower housing section 24 or the periphery of the light emitting module 10 to exhaust the air from the housing. The air exhaust ports 3 may be formed on the heat sink base 12 of the light emitting module 10, which supports the PCB 14 having the semiconductor optical devices 16 mounted thereon, or formed on the lower end of the housing 20 around the light emitting module 10.

In this embodiment, the air exhaust ports 3 are formed in a substantially slit shape along an annular peripheral region of the heat sink base 12 and are arranged at constant intervals. As the air exhaust ports 3 are formed on the annular peripheral region of the heat sink base 12, the air exhaust ports 3 can be advantageously placed at intended locations simply by mounting the PCB and the semiconductor optical devices on the heat sink base 12 and assembling the light emitting module 10 to the open region of the lower end of the housing 20.

Further, other advantageous effects obtained by providing the air exhaust ports 3 to the heat sink base 12 constituting the light emitting module 10 will be apparent to a person having ordinary knowledge in the art from the detailed description and the accompanying drawings.

Light Emitting Module 10

Figure 17:
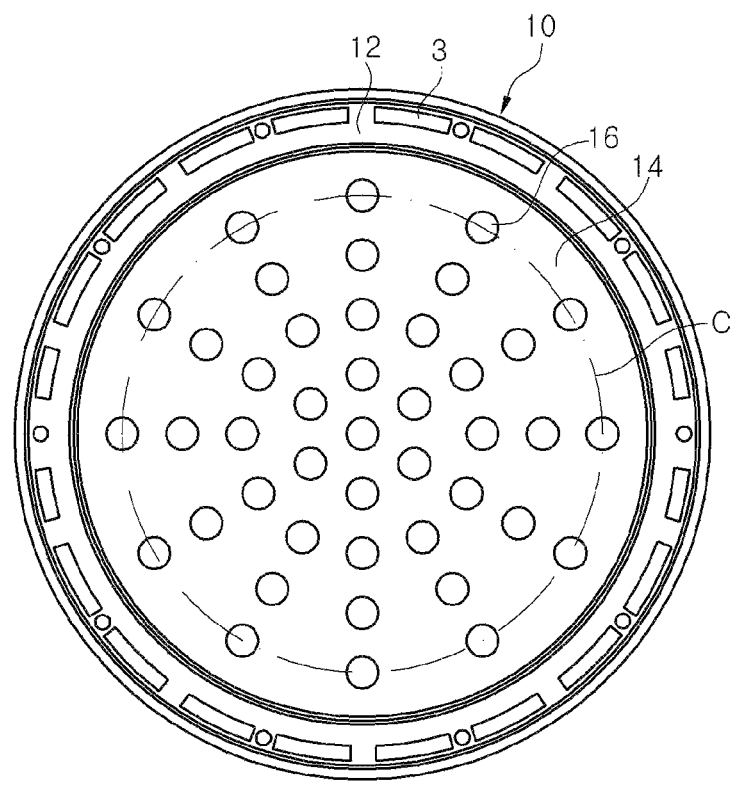
FIG. 17 is a bottom view of a light emitting module of the optical semiconductor-based lighting apparatus of FIG. 16.

Referring to FIG. 17, the light emitting module 10 includes a substantially circular PCB 14 and a plurality of semiconductor optical devices 16 mounted on the PCB 14. The semiconductor optical devices 16 may be light emitting devices (LEDs). The semiconductor optical devices 16 are arranged along the periphery of the PCB 14 on a virtual circle (C) indicated by a dash-dot-dotted line, and the plural semiconductor optical devices 16 are arranged over most regions within the circle (C). Although the semiconductor optical device 16 is illustrated as being placed at a central region of the PCB 14 in this embodiment, the semiconductor optical devices 16 may not be placed on the central region of the PCB 14 in order to provide components and wires for driving the semiconductor optical devices.

The PCB 14 may be a metal core PCB (MCPCB) or metal PCB (MPCB) based on a metal board having good thermal conductivity For example, a circular PCB 14 is provided to a substantially disc-shaped heat sink base 12 by attaching or fastening the PCB onto the heat sink base 12. The air exhaust ports 3 are arranged at constant intervals along the periphery of the heat sink base 12 surrounding the circular PCB 14. The heat sink base 12 may be formed of a metallic material such as copper or aluminum, which has good thermal conductivity.

Although the PCB 14 is illustrated as being coupled to the heat sink base 12 in this embodiment, it can be contemplated that a circuit pattern of the PCB may be directly formed together with an insulation material on the heat sink base 12. Accordingly, although the heat sink base and the PCB have been illustrated as being separate elements, it should be noted that the PCB may be a component of the heat sink base.

Heat Sink Unit

As clearly shown in FIG. 16, the heat sink unit 40 is placed directly above the light emitting module 10 within the housing 20. In addition, the heat sink unit 40 includes heat pipes 44 and a heat sink block 46. The heat pipes 44 are disposed between the heat sink block 46 and the light emitting module 46, and perform heat dissipation with respect to the light emitting module 10 in cooperation with the heat sink block 46.

The heat sink block 46 is constituted by a plurality of heat sink plates 462 arranged in a horizontal direction. Each of the heat sink plates 462 has a circular shape corresponding to the shape of the light emitting module 10, and in this case, the heat sink block 46 constituted by the heat sink plates 462 has a substantially cylindrical shape. Further, each of the heat sink plates 462 has a polygonal shape such as a rectangular shape, and in this case, the heat sink block 46 has a polyhedral shape such as a hexahedral shape. The heat sink block 46 includes a plurality of gaps open towards the cooling fan, and each of the gaps is located between adjacent heat sink plates in a vertical direction.

Each of the heat pipes 44 includes a horizontal line section 44a horizontally disposed to adjoin a rear side of the heat sink base 12 and a vertical line section 44b integrally extending from the horizontal line section 44a in a vertical direction and penetrating the heat sink block 46. A hollow hole in each of the heat pipes 44 extends from the horizontal line section 44a to the vertical section 44b.

The heat pipes 44 receive a cooling fluid therein to remove heat from the heat sink base 12 through operation of the cooling fluid. More preferably the heat pipes 44 receive a liquid such as water or alcohol in a reduced pressure state to remove heat from the heat sink base 12 in such a way that the liquid is converted to vapor by temperature elevation at one side and the vapor is converted again to the liquid through heat dissipation from the vapor at the other side.

At this time, the horizontal line section 44a may be partially inserted or buried in a groove formed in the heat sink base 12, thereby increasing a contact area with respect to the heat sink base 12.

Figure 18:
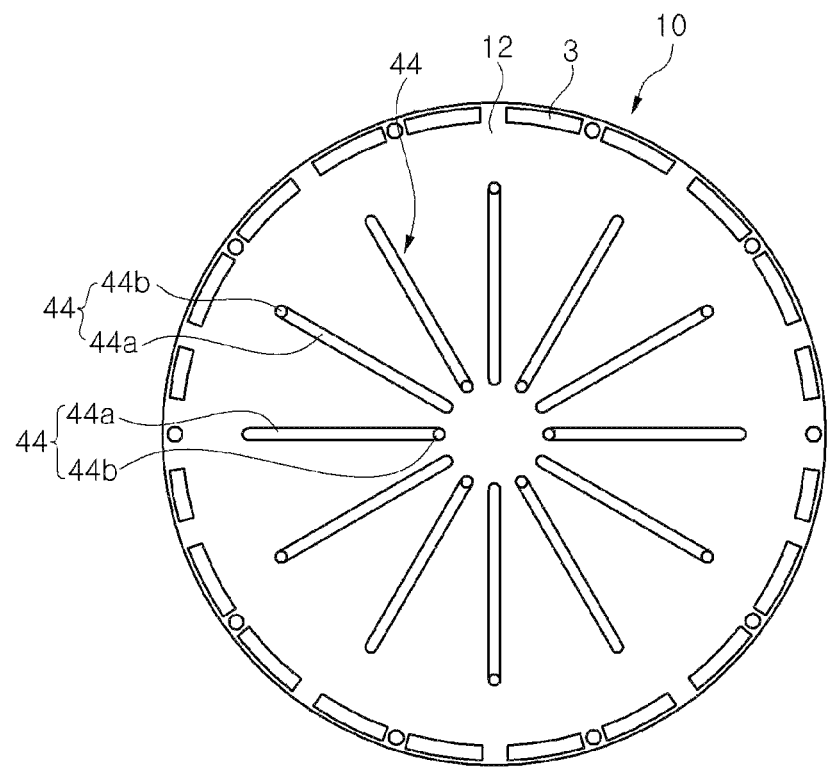
FIG. 18 is a view illustrating a heat sink base and a heat sink unit of the light emitting module shown in FIG. 16 and FIG. 17.

FIG. 18 shows a pattern and structure of heat pipes arranged on the heat sink base 12. Referring to FIG. 18, the horizontal line sections 44a of the heat pipes 44 are radially arranged on the rear side of the heat sink base 12. Each of the horizontal line sections 44a has a substantially straight line shape and extends from a central region of the heat sink base 12 towards a periphery of the heat sink base 12. All of the horizontal line sections 44a have the same length and the horizontal line sections 44a are arranged at a certain angle in a rotational direction. Each of the horizontal line sections 44a is integrally connected at one end thereof to the vertical section 44b.

In this embodiment, the heat pipe 44 including the vertical line section 44b at one end thereof adjacent the central region of the heat sink base 12 and the heat pipe including the vertical line section 44b at the other end thereof adjacent the periphery of the heat sink base 12 are present together on the rear side of the heat sink base 12. More preferably, the heat pipe 44 including the vertical line section 44b at one end of the horizontal line section 44a adjacent the central region of the heat sink base 12, and the heat pipe 44 including the vertical line section 44b at the other end of the horizontal line section 44a adjacent the periphery of the heat sink base 12 are alternately arranged.

By the alternate arrangement of the heat pipes described above, the vertical line sections 44b alternately penetrate the heat sink block 46 at a place near the central region of the heat sink block 46 and a place near the periphery of the heat sink block 46 (see FIG. 16). This arrangement may contribute to improvement of heat dissipation by preventing heat emitted from the heat pipes 44 from being concentrated on the periphery or central region of the heat sink block 46.

Figure 19:
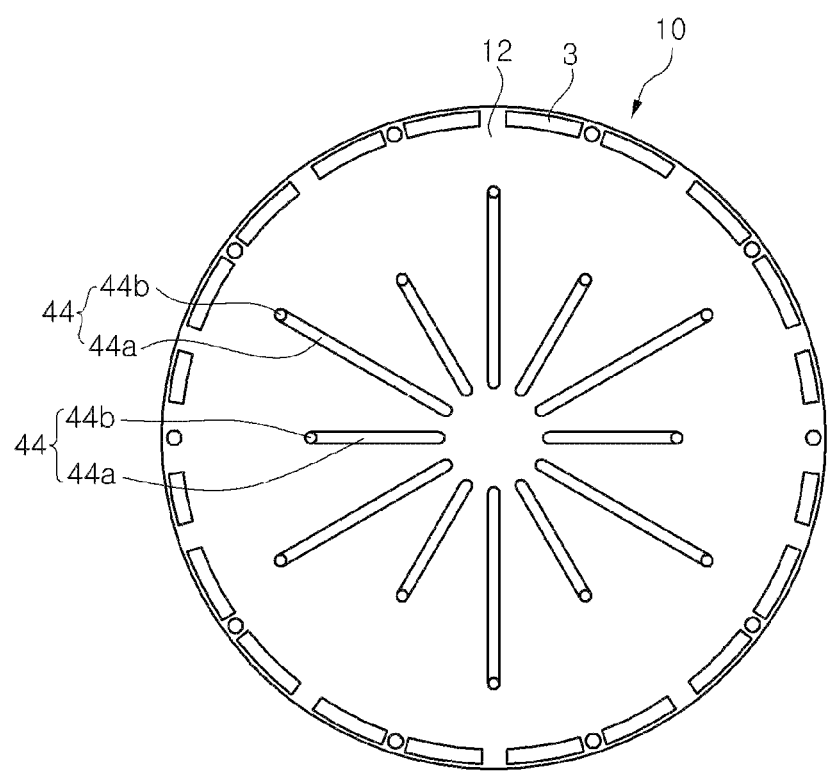
FIG. 19 is a view of a heat sink unit having a heat pipe arrangement according to another embodiment of the present invention.

FIG. 19 shows another embodiment of a heat pipe structure for improving heat dissipation efficiency. Referring to FIG. 19, horizontal line sections 44a of alternately arranged heat pipes have alternately different lengths. This arrangement prevents heat from the heat pipes 44 from being concentrated on the periphery or central region of the heat sink block 46 (see FIG. 16), thereby improving heat dissipation efficiency.

Figure 20:
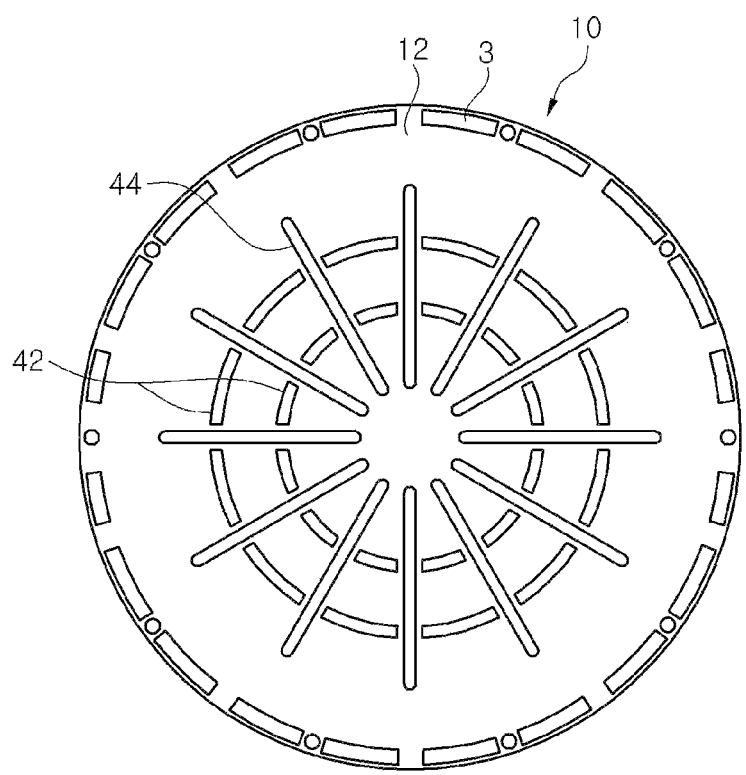
FIG. 20 is a view of a heat sink unit having a heat pipe arrangement according to a further embodiment of the present invention.

FIG. 20 is a view of a heat sink unit including a heat pipe arrangement according to a further embodiment of the invention. Referring to FIG. 20, subsidiary heat pipes 42 are disposed between adjacent horizontal line sections 44a of radially arranged heat pipes 44. These subsidiary heat pipes 42 are placed in a region between the adjacent horizontal line sections 44a, on which the horizontal line sections 44a of the heat pipes are not present, thereby contributing to improvement of heat dissipation efficiency in cooperation with the heat pipes. The subsidiary heat pipes 42 may be composed only of horizontal line sections, which adjoin the heat sink base 12.

According to the present invention, the lighting apparatus includes the plurality of heat pipes 44 and/or 42 adjoining the rear side of the heat sink base 12. The plurality of heat pipes includes the main heat pipes 44, which perform heat dissipation in corporation with the heat sink block 46 constituted by the plurality of heat sink plates 462, and the subsidiary heat pipes 42, which perform heat dissipation without cooperating with the heat sink block 46. The main heat pipes 44 may adjoin the heat sink base 12 in a straight line pattern without a curved or rounded shape, and the subsidiary heat pipe 42 may adjoin the heat sink base 12 in a pattern including a curved or rounded shape. Further, the subsidiary heat pipes 42 may cover a region, which is difficult to cover with the main heat pipes 44 having a straight line shape, in a circular, arcuate, curved or rounded pattern.

Figure 21:
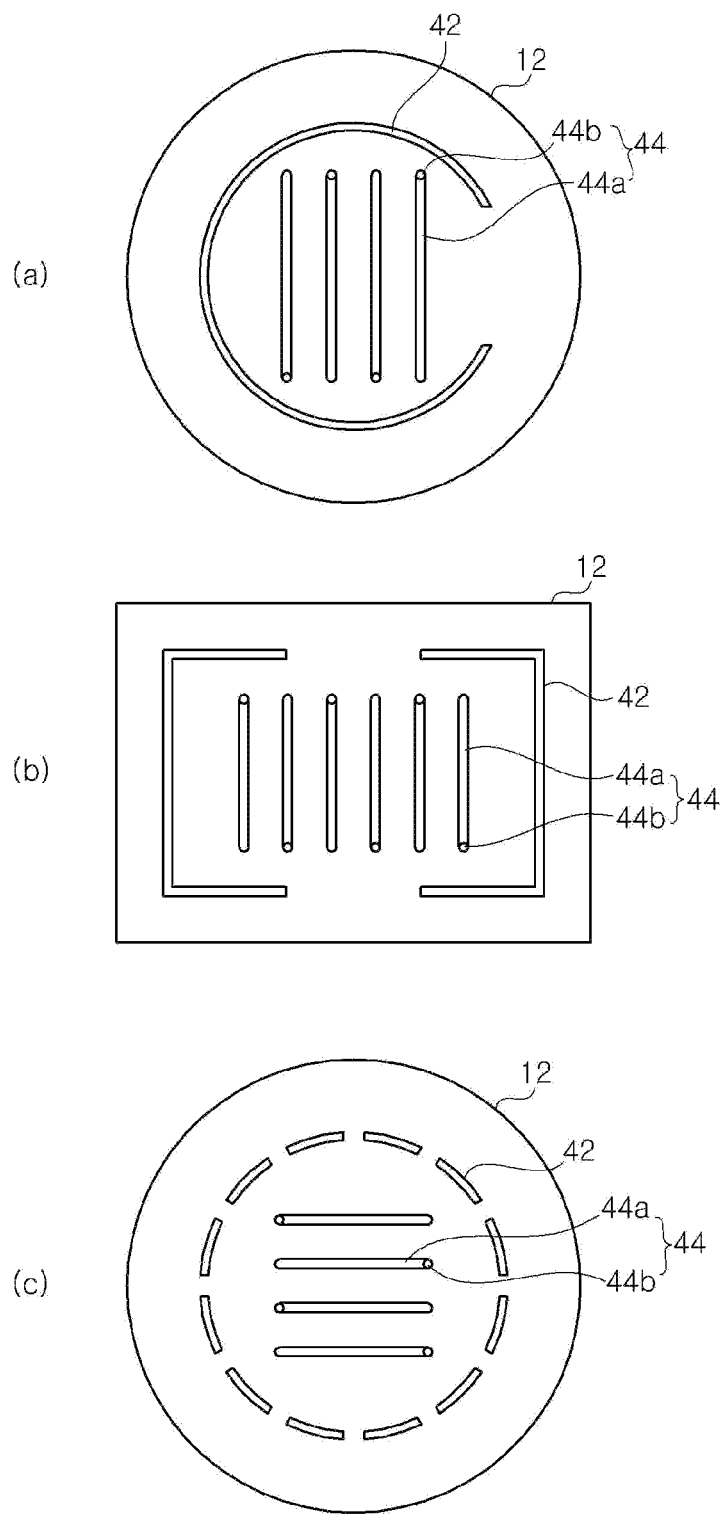
FIGS. 21(*a*), (*b*) and (*c*) are views of other embodiments of the heat pipe arrangement according to the present invention.

FIGS. 21(a), (b) and (c) show other embodiments of the heat pipe arrangement according to the present invention.

Referring to FIGS. 21(a), (b) and (c), a plurality of main heat pipes 44 having a straight line shape is placed in or near a central region of a heat sink base 12 on a rear side of the heat sink base 12, and subsidiary heat pipes 42 are placed along a periphery of the heat sink base 12 on the rear side thereof, at which the plurality of main heat pipe 44 is not present. At this time, since the subsidiary heat pipes 42 do not need to cooperate with the heat sink block 46 (see FIG. 1) as described above, the subsidiary heat pipes 42 may be two-dimensionally arranged on the rear side of the heat sink base 12 and have a circular, arc, curved or rounded pattern to cover a wider range.

Referring to FIG. 21(a), a single subsidiary heat pipe 42 is disposed in a substantially "C" shape along the periphery of the heat sink base 12, and a plurality of main heat pipe 44 is disposed in a central region of the het sink base 12 inside the subsidiary heat pipe 42 to adjoin the heat sink base 12 in a straight line pattern. Each of the main heat pipes 44 includes a horizontal line section 44a, which has a straight line shape and adjoins the rear side of the heat sink base 12, and an additional line section 44b, which extends therefrom to penetrate the heat sink block 46.

Referring to FIG. 21(b), two subsidiary heat pipes 42 each having a rectangular shape open at one side ("⊏") are disposed along edges of the heat sink base 12 having a rectangular shape, and a plurality of main heat pipes 44 having a straight line shape are disposed on a region defined inside the two subsidiary heat pipes 42. Each of the main heat pipes 44 includes a horizontal line section 44a, which has a straight line shape and adjoins the rear side of the heat sink base 12, and an additional line section 44b, which extends therefrom to penetrate the heat sink block 46.

Referring to FIG. 21(c), a plurality of arcuate subsidiary heat pipes 42 is disposed in a substantially circular arrangement along a periphery of a circular heat sink base 12, and a plurality of main heat pipes 44 having a straight line shape is disposed on a region defined inside the plurality of subsidiary heat pipes 42 to adjoin the heat sink base 12. Each of the main heat pipes 44 includes a horizontal line section 44a, which has a straight line shape and adjoins the rear side of the heat sink base 12, and an additional line section 44b, which extends therefrom to penetrate the heat sink block 46.

Although not shown in the drawings, the heat pipe may further include additional line sections between the line section adjoining the heat sink base and the line section penetrating the heat sink block and adjoining the heat sink block in order to connect these line sections without adjoining the heat sink base and without adjoining the heat sink block.

Application of Air Cooling Unit

A cooling fan 60 and a power supply 80 are disposed at the upper housing section 22. The horizontal upper housing section 22 and the vertical lower housing section 24 include an intersection region I therein, and the heat sink block 46 constituting part of the heat sink unit 40 is placed in the intersection region I.

The cooling fan 60 and the power supply 80 are disposed in this order towards a rear end of the upper housing section 22 in the lateral direction of the heat sink block 46. With this arrangement, the cooling fan 60 is placed between the heat sink block 46 and the power supply 80. Further, the air suction ports 2 formed at the rear end of the upper housing section 22 are place adjacent the power supply 80.

The cooling fan 60 suctions external air through the air suction ports 2 such that the external air cools the power supply 80 upstream of the cooling fan 60 and cools the heat sink block 46, the heat pipes 44 and the heat sink base 12 adjoining the heat pipes downstream of the cooling fan 60. Then, the external air is discharged through the air exhaust ports 3 after cooling the components. The cooling fan 60 may be rotated in the clockwise or counterclockwise direction. When the cooling fan 60 is rotated in the counterclockwise direction, the air exhaust ports 3 serve as the air suction ports through which external air is suctioned, such that the external air sequentially cools the heat sink base 12, the heat pipe 44 adjoining the heat sink base 12, the heat sink block 46, and the power supply 80. Finally, the external air is discharged through the air suction ports 2, which serve as the air exhaust ports.

The heat sink block 46 includes a plurality of gaps open towards the cooling fan, and each of the gaps is located between adjacent heat sink plates 462 in a vertical direction. Since the gaps of the heat sink block 46 are open towards the cooling fan 60 located at a lateral side of the heat sink block 46, the heat sink block 47 allows air suctioned by the cooling fan 60 to cool the overall area of each of the heat sink plates 462 while flowing through the gaps. Furthermore, each of the heat sink plates 462 may include a plurality of air flow holes 4622. The plurality of air flow holes 4622 provides good flow of air directed from the heat sink block 46 towards the heat sink base 12. The air flow holes 4622 may be formed to cross each other between the heat sink plates 462, thereby providing more efficient cooling of the heat sink plates 462 by the air flowing therethrough.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An optical semiconductor-based lighting apparatus, comprising:
   a housing;
   a light emitting module disposed on an open region at one side of the housing;
   a heat sink unit placed within the housing to absorb and discharge heat from the light emitting module,
   the light emitting module comprising a heat sink base on which a semiconductor optical device is mounted,
   the heat sink unit comprising at least one main heat pipe having one side adjoining the heat sink base and a heat sink block adjoining the other side of the main heat pipe to cooperate with the main heat pipe, and
   further comprising at least one subsidiary heat pipe independent of the heat sink block and disposed on the heat sink base.

2. The lighting apparatus of claim 1, further comprising:
   a pipe securing unit that secures a line section of the main heat pipe to the heat sink base, the pipe securing unit comprising a lower securing plate defining a groove for receiving the line section of the main heat pipe and an upper securing plate covering the groove and fastened to an upper surface of the lower securing plate.

3. The lighting apparatus of claim 1, wherein the heat sink base has a dense region where a plurality of main heat pipes is densely arranged, and the subsidiary heat pipe is placed outside the dense region.

4. The lighting apparatus of claim 3, wherein the subsidiary heat pipe comprises a peripheral line section formed along a periphery of the heat sink base.

5. The lighting apparatus of claim 1, wherein the heat sink block comprises a plurality of heat sink plates separated from each other to be parallel to each other, and the main heat pipe is disposed to pass through the heat sink plates.

6. The lighting apparatus of claim 5, wherein a ratio of a thickness of each of the heat sink plates to a distance between the heat sink plates is in the range from 1:1.5 to 1:5.

7. The lighting apparatus of claim 5, further comprising a cooling fan disposed within the housing to cool the heat sink plates with forced air, wherein the heat sink plates are separated from the heat sink base with lower ends thereof placed adjacent the heat sink base, and are separated from the cooling fan with upper ends thereof placed adjacent the cooling fan.

8. The lighting apparatus of claim 5, wherein the main heat pipe comprises a lower line section adjoining the heat sink base, an upper line section penetrating the heat sink plates, and a middle line section connecting the lower line section to the upper line section.

9. The lighting apparatus of claim 8, wherein each of the upper and lower line sections has a straight line shape.

10. The lighting apparatus of claim 8, wherein the middle line section is perpendicular to the upper and lower line sections.

11. The lighting apparatus of claim 8, wherein the heat sink unit comprises a first main heat pipe and a second main heat pipe, and the first and second main heat pipes penetrate the heat sink plates at different heights by a height difference between the middle line sections.

12. The lighting apparatus of claim 11, wherein the first main heat pipe and the second main heat pipe are alternately arranged.

13. An optical semiconductor-based lighting apparatus, comprising:
- a housing;
- a light emitting module disposed on an open region at one side of the housing; and
- a heat sink unit placed within the housing to absorb and discharge heat from the light emitting module,
- the light emitting module comprising a heat sink base on which a semiconductor optical device is mounted, the heat sink unit comprising a plurality of heat pipes adjoining the heat sink base,
- wherein the plurality of heat pipes comprises main heat pipes adjoining the heat sink base and extending upwards to penetrate a heat sink block, and
- wherein the plurality of heat pipes comprises at least one subsidiary heat pipe independent of the heat sink block and adjoining the heat sink base.

14. The lighting apparatus of claim 13, wherein the subsidiary heat pipe comprises a circular, arcuate, curved, or rounded pattern on the heat sink base.

15. The lighting apparatus of claim 13, wherein the main heat pipes comprises horizontal line sections radially arranged on the heat sink base and vertical line sections vertically extending from the horizontal line sections and penetrating the heat sink block.

16. The lighting apparatus of claim 13, wherein the subsidiary heat pipe is disposed near a periphery of the heat sink base, and the main heat pipes are disposed in a central region surrounded by the subsidiary heat pipe.

17. The lighting apparatus of claim 13, further comprising a heat sink block disposed to cooperate with at least one heat pipe among the plurality of heat pipes, the heat sink block comprising a plurality of heat sink plates.

18. The lighting apparatus of claim 17, wherein each of the heat sink plates comprises a plurality of air flow holes.

19. The lighting apparatus of claim 17, wherein the housing comprises an intersection region at which an upper housing section intersects a lower housing section within the housing, the heat sink block is placed in the intersection region such that a lower surface of the heat sink block faces downwards and a side surface of the heat sink block faces the cooling fan disposed at the upper housing section.

20. The lighting apparatus of claim 17, wherein the housing comprises an intersection region at which an upper housing section intersects a lower housing section within the housing, the heat sink block being placed in the intersection region such that flat surfaces of the heat sink plates face downwards and gaps between the heat sink plates face in a lateral direction, and a cooling fan is placed in a lateral direction of the heat sink block.

21. The lighting apparatus of claim 20, further comprising a power supply placed adjacent a rear end of the upper housing section, wherein the cooling fan is placed between the power supply and the heat sink block.

22. The lighting apparatus of claim 20, wherein at least one of the heat pipes extends upwards to penetrate the heat sink plates.

* * * * *